United States Patent [19]
Yamada et al.

[11] 3,986,154
[45] Oct. 12, 1976

[54] AUTOMATIC TUNING APPARATUS
[75] Inventors: Yasuhiro Yamada, Neyagawa;
Kazuyoshi Tsukamoto, Hirakata;
Yoshiaki Sakauchi, Tenri; Kazufumi
Ushijima, Hirakata, all of Japan
[73] Assignee: Sanyo Electric Co., Ltd., Osaka,
Japan
[22] Filed: July 10, 1975
[21] Appl. No.: 594,774

[30] Foreign Application Priority Data
July 18, 1974 Japan.............................. 49-83080
Dec. 13, 1974 Japan............................ 49-143710

[52] U.S. Cl................................ 334/15; 307/320;
325/464; 325/469; 334/16
[51] Int. Cl.² ......................................... H03J 3/18
[58] Field of Search ................... 334/15, 16, 18, 26;
325/464, 468, 469; 307/271, 295, 320

[56] References Cited
UNITED STATES PATENTS
3,651,411 3/1972 Zlotnick........................... 334/15 X
3,688,199 8/1972 Saeki et al. ...................... 334/26 X
3,893,049 7/1975 Bray................................ 325/468 X Primary Examiner—Paul L. Gensler
Attorney, Agent, or Firm—Stewart and Kolasch, Ltd.

[57] ABSTRACT
An automatic tuning apparatus comprising a tuner having a tank circuit employing a voltage controlled variable capacitance diode as a circuit element, which diode is supplied in the reverse direction with a scanning control voltage from a solid state potential memory device, which control voltage is varied under the control of a scanning voltage control circuit to scan the frequencies in the frequency band by the tuner and is set by a scan stop signal obtained from the tuner as a result of tuning of the tuner to a certain frequency, and a pair of manual switches for upward and downward scanning, a first flip-flop to be reset by the closing of either manual switch and to be set by the scan stop signal, a second flip-flop to be set and reset by the closing of the downward and upward scanning switches, respectively, a third flip-flop to be set and reset by the closing of both manual switches and caused to be reversed in the storing state thereof when the scanning voltage reaches the maximum or minimum value thereof, the said scanning voltage control circuit being controlled by the logical combination of the storing state of these flip-flops such that the frequency is scanned gradually in the direction as selected by the manual switch but rapidly in the direction not selected by the switch.

19 Claims, 16 Drawing Figures

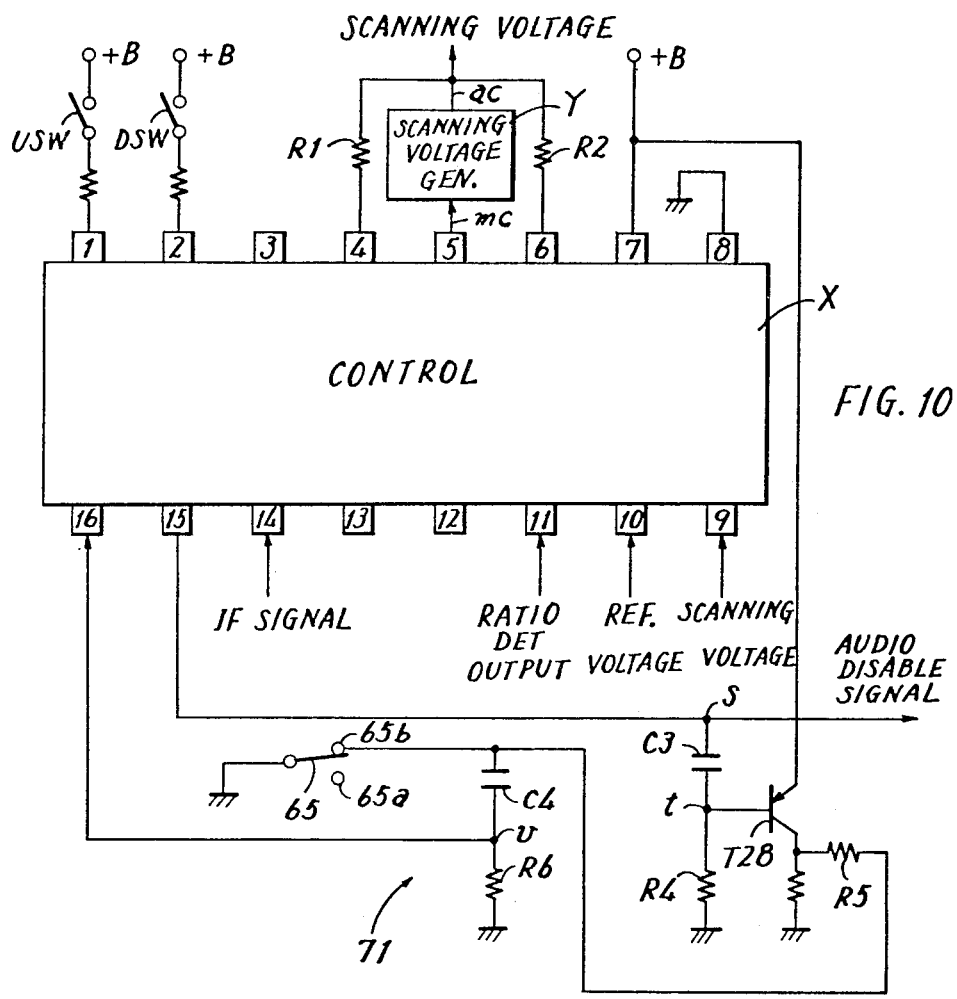
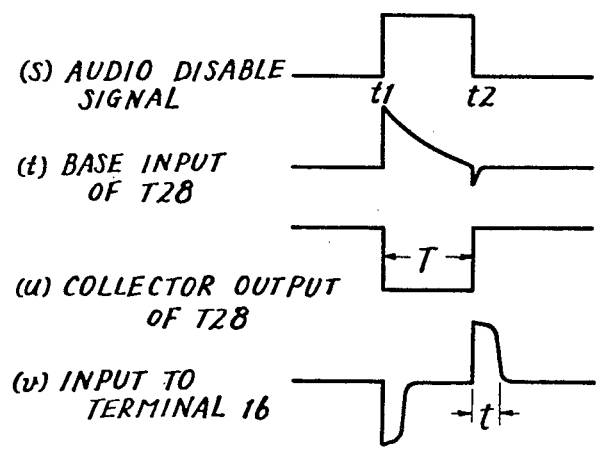
FIG. 10
FIG. 11

AUTOMATIC TUNING APPARATUS

BACKGROUND OF THE INVENTION

1. Field of the Invention

The present invention relates to an automatic tuning apparatus. More specifically, the present invention relates to an improved automatic tuning apparatus employing a voltage controlled variable reactance device.

2. Description of the Prior Art

Recently an automatic tuning apparatus employing a voltage controlled variable capacitor has been widely used in radio receivers, television receivers and the like. Such a voltage controlled variable capacitor uses a capacitance formed at a barrier portion of a diode, variable as a function of a reverse voltage applied thereacross and is known as a variable capacitance diode. In such an automatic tuning apparatus, it is necessary to provide a voltage supply capable of providing a voltage variable as chosen in response to manual operation, which causes a capacitance with which the tuning apparatus selects desired tuning frequency and thus selects a desired transmitting station. It is well known that such a voltage is closely related with the tuning frequency and thus the selected transmitting station.

One type of such a voltage supply for providing a voltage variable in response to manual operation to a variable capacitance diode comprises a capacitor and a charging/discharging control circuit therefor, a voltage across the capacitor, as selected in response to a tuning output, being applied to the variable capacitance diode. More specifically, the capacitor is charged or discharged by the charging/discharging control circuit in response to manual operation until a voltage across the capacitor causes capacitance in the diode with which the tuning circuit is tuned to a given frequency to provide a tuning output therefrom when the charging/discharging control circuit is disabled to discontinue to charge or discharge the capacitor, so that the voltage thus provided across the capacitor remains the same. If another tuning frequency is desired, the charging/discharging control circuit is again enabled through manual operation and the abovementioned operation is repeated until another frequency, and thus another transmitting station is selected.

A disadvantage encountered in the automatic tuning apparatus with a voltage controlled variable capacitance diode supplied with a control voltage from a capacitor is that the voltage across the capacitor gradually becomes lower because of leakage through an undesired leakage path, which causes detuning of the selecting apparatus and thus results in a poor quality of sound by the speaker of the radio receiver. In order to solve such a problem it is required to provide a circuit for compensating the decrease in voltage across the capacitor because of leakage which makes the circuit complicated and the system expensive. Another disadvantage in the automatic tuning apparatus using a variable capacitance diode supplied with a voltage across the capacitor is that the voltage across the capacitor is charged or discharged in an exponential manner rather than in a linear manner, which makes it difficult to achieve precise automatic tuning. It is desired that an improved voltage supply source for providing a variable voltage to a variable capacitance diode is provided, which is suited for employment in an automatic tuning apparatus.

A voltage storing device of interest in connection with the present invention is disclosed in the U.S. Pat. No. 3,753,110, issued August 14, 1973 to Hironosuke Ikeda et al., and assigned to Sanyo Electric Co., Ltd., the same assignee as that of the present invention. As set forth in the referenced patent, Professor Takehiko Takahashi and Assistant Professor Osamu Yamamoto, Technological Department of Nagoya University, announced their study on the electrochemical potential memory device by the use of a solid state electrolyte at the 22nd annual assembly of Japan Chemical Association held on Apr. 5th to 7th, 1969. Briefly stated, this device comprises an Ag electrode as a cathode, an Ag-Te alloy electrode as an anode, and a solid state electrolyte having high ion conductivity, such as RbAg$_4$I$_5$ sandwiched between both electrodes. When a DC voltage is applied to the device so that the Ag electrode may be negative, a portion of Ag contained in the Ag-Te alloy electrode migrates over to the Ag electrode, resulting in a decreased activity of Ag in the Ag-Te alloy, and thus an increased potential difference between both electrodes. The inventors of this device termed this state of operation as "charging." When the polarity of the applied DC voltage is reversed to that of the former case, Ag is refilled into the Ag-Te alloy, resulting in the decreased potential difference and returns to the initial value eventually. The inventors of this device termed this state of operation as "discharging." Study disclosed by the inventors of this device indicates that the electromotive force generated by the abovementioned charging or discharging current can cause a linear change to some extent with respect to the charging or discharging time. Thus this device makes it possible to effect write-in and non-destructive read-out operation while preserving relatively linear relation between the charging or discharging time and terminal voltage, and in addition, it can hold the memory condition for a relatively longer period of time. The referenced patent further discloses an improved electrochemical potential memory device. More specifically, FIG. 6 of the referenced patent shows an improved electrochemical potential memory device for eliminating the IR drop across the resistance in the electrolyte and the overvoltage caused by dissolution or deposition of Ag, which is basically characterized by the provision of an auxiliary cathode that comprises an output terminal for detecting the potential separately from the abovementioned cathode available for the input terminal for the current conduction. In view of these advantageous characteristics of the abovementioned memory device, it is possible to utilize this device as a voltage source for providing a voltage variable in response to manual operation to a voltage controlled variable reactance device employed in an automatic tuning apparatus.

As described previously, a typical prior art automatic tuning apparatus comprises a capacitor connected to provide a terminal voltage thereof to a voltage controlled variable capacitance diode coupled associated with a tuning circuit of the automatic tuning apparatus, and a charging/discharging control circuit operable in response to manual operation for enabling the control circuit for charging or discharging the capacitor and in response to an output of said tuning circuit for disabling the control circuit to discontinue to charge or discharge the capacitor, so that the voltage thus provided across the capacitor is applied to the variable capacitance diode to cause a desired capacitance in the diode with which the tuning circuit is tuned to a desired frequency to provide a tuning output therefrom, which tuning output is applied to the charging/discharging control circuit, as described above. Therefore, manual operation of the control circuit only enables the control circuit to start to charge (or discharge) the capacitor and thus to increase (or decrease) the terminal voltage thereof, only resulting in a scanning operation in one direction such as toward a higher (or lower) terminal voltage of the capacitor, and thus toward a smaller (or larger) capacitance in the capacitance diode and accordingly toward a higher (or lower) tuned frequency in the automatic tuning apparatus.

The control circuit is preferably controlled in response to an output from a threshold detector such that the charging or discharging operation of the capacitor may be reversed in response to the threshold detection output of the terminal voltage of the capacitor as at an upper threshold and a lower threshold. In any event, the scanning in one direction, or the unidirectional scanning, such as either toward a higher frequency (or upward scanning) or toward a lower frequency (or downward scanning) is disadvantageous in that a given desired broadcasting station will be selected as a result of tuning by the automatic tuning apparatus only after substantially one full cycle of such a unidirectional scanning operation when it is desired to select such a station again soon after the station is once tuned and thereafter another adjacent frequency station is tuned as a result of scanning. Thus it is desired that an improved automatic tuning apparatus is provided which enables versatile scanning operation and thus facility in manual operation with a simplified electrical circuit configuration.

SUMMARY OF THE INVENTION

Briefly stated, the present invention comprises an automatic tuning apparatus comprising tuning means comprising a voltage controlled variable reactance device, means for supplying a control voltage to said voltage controlled variable reactance device, said control voltage determining reactance of said voltage controlled variable reactance device and thus determining a tuning frequency of said tuning means, means coupled to said tuning means for providing a signal indicative of the degree of tuning of said tuning means, means for changing said control voltage supplied from said control voltage supplying means for causing a change in reactance of said voltage controlled reactance device and thus a change in a tuning frequency of said tuning means, and manually operable means for instructing said change in a tuning frequency of said tuning means, characterized in that said apparatus further comprises first store means responsive to the instructing signal of said manually operable means for assumming one storing thereof and responsive to said signal indicative of the degree of tuning of said tuning means for assuming the other storing state, second store means responsive to the instructing signal of said manually operable means for assuming a predetermining storing state thereof and responsive to a predetermined maximum value or a predetermined minimum value of said control voltage for reversing the present storing state thereof, means responsive to the storing state of said second store means for determining a direction of the change of said control voltage and means responsive to said one storing state of said first store means for enabling said means for changing said control voltage, whereby versatile operation modes of the apparatus can be achieved.

In a preferred embodiment of the present invention, said manually operable means comprises first manually operable means for instructing said change in a tuning frequency of said tuning means in the direction toward a higher frequency and second manually operable means for instructing said change in a tuning frequency of said tuning means in the direction toward a lower frequency, and the apparatus further comprises third store means responsive to the instructing signal of said first manually operable means for assuming one storing state thereof and responsive to the instructing signal of said second manually operable means for assuming the other storing state thereof, whereby a tuning frequency of said tuning means is changed in a relatively slow speed in the direction selected by said manually operable means and in a relatively rapid speed in the direction not selected by said manually operable means.

In a further preferred embodiment of the present invention, the apparatus further comprises means for causing said first store means to assume the other storing state after the lapse of a predetermined time period since said control voltage changing means is disabled responsive to said other storing state of said first store means, whereby the scanning is stopped by the stop signal only for a given period of time to maintain the reception state but the scanning is started again automatically after the lapse of the abovementioned period of time.

Therefore, it is a principal object of the present invention to provide an improved automatic tuning apparatus using a voltage controlled variable reactance device.

It is another object of the present invention to provide an improved automatic tuning apparatus using a voltage controlled variable reactance device capable of achieving the operation mode of versatility.

It is a further object of the present invention to provide an improved automatic tuning apparatus which enables versatile scanning operation mode and thus facility in manual operation thereof.

According to an aspect of the present invention, an automatic tuning apparatus is provided which enables various scanning operation modes, such as a unidirectional scanning operation mode (upward scanning operation mode or downward scanning operation mode), a bidirectional scanning operation mode, a continued stop scanning operation mode, and a temporary stop scanning operation mode, as specifically defined in the present specification.

These objects and other objects and features of the present invention will be better understood when taken in conjunction with the following detailed description made with reference to the accompanying drawings.

BRIEF DESCRIPTION OF THE DRAWINGS

FIG. 7 is a graph showing a relation between the scanning voltage and the time for explanation of operation of the embodiment shown, in which FIG. 7(a) shows the upward scanning operation mode, FIG. 7(b) shows the downward scanning operation mode, FIG. 7(c) shows the bidirectional scanning operation mode, and the FIG. 7(d) shows the temporary stop scanning operation mode in the upward scanning, FIG. 10 is a schematic diagram of a further embodiment of the present invention, and FIG. 11 shows waveforms of signals at various portions in FIG. 11.

DESCRIPTION OF THE PREFERRED EMBODIMENTS

Typical Automatic Tuning Apparatus

Figure 1:
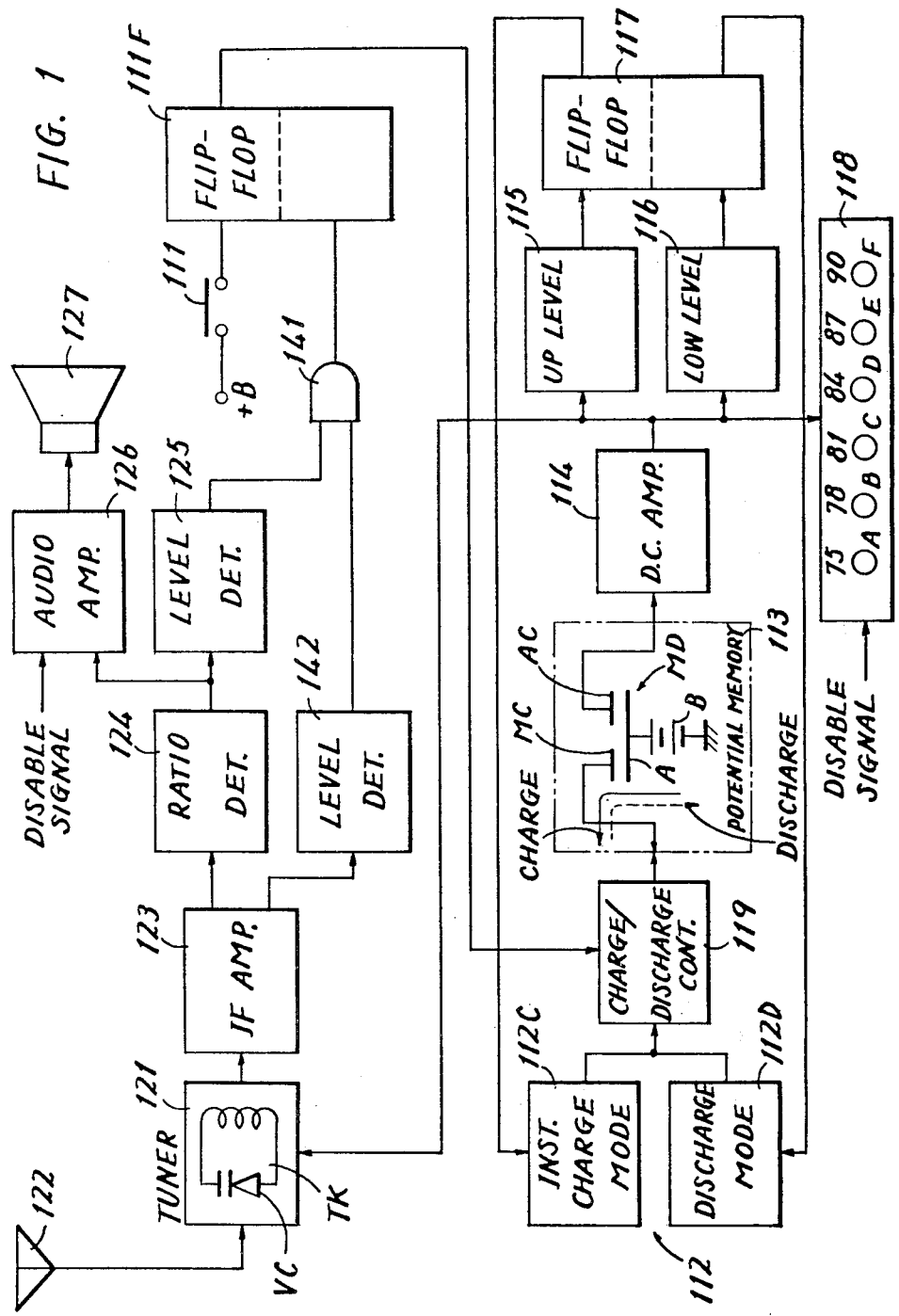
FIG. 1 is a block diagram of an automatic tuning apparatus in which the present invention can be advantageously employed.

FIG. 1 illustrats a block diagram of an FM radio receiver employing an automatic tuning apparatus having a tuning or tank circuit employing a voltage controlled variable capacitance diode which is supplied with a scanning control voltage from a voltage source using the abovementioned potential memory device, in which the present invention can be advantageously embodied as to be more fully described subsequently. A major portion of a typical radio receiver is shown in the upper half portion of the FIG. 1 diagram, which comprises an antenna 122, a tuner 121, an intermediate frequency amplifier 123, a ratio detector 124 coupled to the intermediate frequency amplifier 123 for detecting the frequency of the intermediate frequency output and subsequent audio stages, such as an audio amplifier 126 and a speaker 127, which are well known and therefore not described in detail. The tuner 121 usually comprises a high frequency amplifier, a local oscillator and a mixer. For the purpose of embodying the present invention, the tuner 121 of the radio receiver shown further comprises a voltage controlled variable reactance device VC, which is connected so as to constitute a part of a tuning circuit TK for the high frequency amplifier and the local oscillator. A typical and preferred voltage controlled variable reactance device of a solid state type now commercially available is a voltage controlled variable capacitor. As described in the foregoing, such a voltage controlled variable capacitor uses a capacitance formed at a barrier portion of a semiconductor diode, which is variable as a function of or in reverse proportion to a reverse voltage applied thereacross, and is also known as a variable capacitance diode. However, it should be understood that any type of a voltage controlled variable reactance device can be used for the purpose of the present invention, so far as it is available.

FIG. 1 also shows in the lower half portion thereof an embodiment of an automatic tuning apparatus incorporated in the abovementioned radio receiver. Briefly stated, the automatic tuning apparatus shown is enabled to start automatic tuning operation by manual operation of a switch, which causes the above-mentioned potential memory device to be discharged or charged and thus the increased or decreased voltage thereacross to be applied to the voltage controlled variable capacitance diode connected associated with tuning circuits in the tuner, until any one of the broadcasting stations is selected as a result of tuning in the tuner, when a tuning output is obtained in a form of an intermediate frequency signal from the intermediate frequency amplifier, which is used to stop discharging or charging of the potential memory device, with the result that the frequency of a given transmitting station is automatically selected. A further detailed description of the automatic tuning apparatus shown is given in the following with particular reference to the lower half portion of the FIG. 1 diagram.

Referring again to FIG. 1, the automatic tuning apparatus comprises a manually operable switch 111 for starting the scanning of the broadcasting frequency band, which comprises an upward scanning switch, which is energized by a +B voltage source and is connected to a set input of a flip-flop 111F. A reset input to the flip-flop 111F is connected from an output of an AND gate 141. One input of the AND gate 141 is supplied with an output of a level detector 125 which level detects the ratio detected audio signal outputted from the ratio detector 124, while the other input of the AND gate 141 is supplied with an output from an amplitude level detector 142, which level detects the amplitude of the intermediate frequency signal from the amplifier 123. A charging/discharging control circuit 119 is provided to control charging or discharging of a potential memory device MD of a potential memory device circuit 113 as a function of an output from the switch 111 and a disabling signal associated with an output from the intermediate frequency amplifier 123, as to be described hereinafter. An output of the potential memory device circuit 113 is supplied to a DC amplifier 114. An output from the amplifier 114 is fed to the tuner 121 as the scanning control voltage. In the tuner 121, an output from the DC amplifier 114 is fed to the voltage controlled variable capacitor VC in the reverse direction, as well known in those skilled in the art. An output from the amplifier 114 is also fed to an upper threshold detector 115 and a lower threshold detector 116, so that either of the outputs from the detectors 115 and 116 in response to a predetermined upper threshold or lower threshold of the output from the amplifier 114 sets or resets a flip-flop 117, respectively. The reset output of the flip-flop 117 is connected through a discharge mode control circuit 112D to the charging/discharging control circuit 119, so that the circuit 119 is caused to effect the discharging operation mode, while the set output of the flip-flop 117 is connected through an instantaneous charge mode control circuit 112C to the charging/discharging control circuit 119, so that the circuit 119 is caused to effect the instantaneous charging operation mode.

Figure 6:
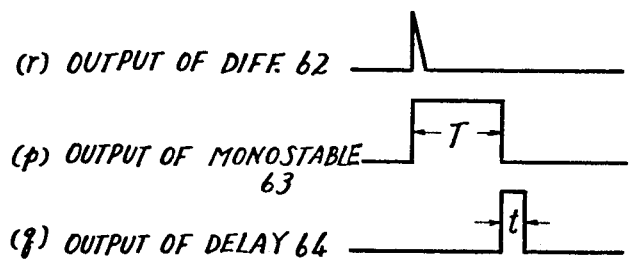
FIG. 6 shows waveforms of the signals at various portions in the FIG. 5C embodiment.

The potential memory device MD may be the same as the FIG. 6 embodiment disclosed in the patent referenced previously. More specifically, the potential memory device MD comprises a main cathode MC and an auxiliary cathode AC of Ag, an anode A of an Ag-Te alloy, and a solid state electrolyte having high ion conductivity, such as $RbAg_4I_5$ sandwiched between the cathodes MC and AC and anode A. The main cathode MC is connected to an output of the charging/discharging control circuit 119 for the purpose of charging or discharging of the memory device MD, and the auxiliary cathode AC is connected to the input of the DC amplifier 114 for the purpose of amplifying the terminal voltage of the memory device MD, while the anode A is connected to an anode of a battery B a cathode of which is grounded. Thus, it is seen that the potential memory device MD and the battery are connected in series in an opposite polarity. When a DC voltage is applied to the device MD so that the main cathode MC may be negative, a charging current flows from the anode A to the cathodes MC and AC and a portion of Ag contained in the anode A migrates over to the cathodes, resulting in an increased terminal voltage of the potential memory device MD per se and thus a decreased output voltage from the circuit 113 because of the above described opposite polarity connection. This operation is referred to as "charging" in the present specification. On the other hand, when a DC voltage is applied to the device MD in the reverse direction as compared with the former case, Ag is refilled into the anode A, resulting in the decreased terminal voltage of the potential memory device MD per se and thus an increased output voltage from the circuit 113 because of the above described opposite polarity connection. This operation is referred to as discharging in the present specification.

The operation of the FIG. 1 embodiment will be better understood by the following description. For the purpose of describing the operation of the embodiment shown, first let it be assumed that the scanning switch 111 is manually operated. Further let it be assumed that no radio broadcasting signal has been broadcast in the frequency band and the flip-flop 117 has been reset so that the circuit 119 is caused to be in the discharging mode. When the scanning switch 111 is manually operated, the flip-flop 111F is set and the charging/discharging control circuit 119 is enabled and thus the potential memory device MD is discharged, as specifically defined in the present specification, in a normal speed, whereby the terminal voltage of the device MD is gradually decreased and thus the output voltage from the circuit 113 is gradually increased, which is amplified by the DC amplifier 114.

The increasing output voltage from the DC amplifier is applied to the variable capacitance diode VC in the tuner 121, which causes a decrease in capacitance across the diode VC and thus a scanning operation by the tuner 121 toward a higher frequency. If the device MD had been caused to continue further the discharging mode, then the device MD would have been destroyed because of overdischarging. However, in the embodiment shown, an output from the DC amplifier 114, which corresponds to the upper threshold voltage of the device MD but has been amplified by the amplifier 114, is threshold detected by the upper threshold detector 115 to cause the flip-flop 117 to be set. Therefore, no reset output from the flip-flop 117 is applied to the discharge mode control circuit 112D, while a set output from the flip-flop 117 is applied to the instantaneous charge mode control circuit 112C, so that the control circuit 112 is caused to be in an instantaneous charge mode, and thus the potential memory device MD is instantaneously charged, as specifically defined in the present specification. In the embodiment shown, the output from the DC amplifier 114, which corresponds to the lower threshold voltage of the output from the circuit 113 reached as a result of the instantaneous charging of the device MD but has been amplified by the amplifier 114, is threshold detected by the lower threshold detector 16 to cause the flip-flop 117 to be reset. The reset output from the flip-flop 117 is applied thereafter to the discharge mode control circuit 112D so that the control circuit 119 is caused to be in the normal discharging mode again. Thereafter the same operation is repeated as mentioned above.

It is understood from the foregoing description that in a time period of the normal discharging mode a reset output is provided from the flip-flop 117 to enable the control circuit 112D and in a time period of the instantaneous charge mode a set output is provided from the flip-flop 117 to enable the control circuit 112C. In the discharging and charging mode period of time an output from the DC amplifier 114 is applied to the tuner 121.

As described previously, in the tuner 121, the said output is applied as a scanning control voltage to voltage controlled variable capacitors connected associated with the tuning circuits for a high frequency amplifier and a local oscillator. Therefore, it is understood that it is necessary to choose a range of change in voltage of the memory device such that the said range suffices to cover voltage values which are required to receive all the broadcasting frequencies by the use of the tuner 121 employing the said voltage controlled variable capacitor so as to be supplied with the said voltage values.

Now let it be assumed that some radio broadcasting stations are broadcasting using different frequencies in a certain area. Further let it be assumed that the potential memory device MD has been charged to an initial point. When the scanning switch 111 is manually operated, the flip-flop 111F is set and the automatic tuning apparatus is caused to be in the normal discharging mode, or the upward scanning mode. When the output voltage of the potential memory device circuit 113 comes to correspond to a frequency of carrier wave in which a radio signal has been broadcast, the tuner 121 automatically makes tuning to the frequency and selects the transmitting station, so that an intermediate frequency output is provided at the intermediate frequency amplifier 123 and an output is provided from the amplitude level detection circuit 142. Just when the tuner 121 makes precise tuning to the frequency, an output is also provided from the ratio detector 124 and thus the level detection circuit 125. Therefore, the input condition of the gate 141 is met and an output is obtained from the gate 141. The output from the AND gate 141 resets the flip-flop 111F and thus disables the charging/discharging control circuit 119 so that the normal discharging mode is discontinued thereafter. Such a state as thus established is kept unchanged and thus the voltage of the memory device circuit 113 remains the same until a further manual operation is made of the switch 111. Upon such a manual operation of the switch 111, the charging/discharging control circuit 119 is again forced in an enabled condition of the normal discharging mode, so that the radio frequency band is scanned in the abovementioned manner from a lower frequency to a higher frequency, until another frequency now in broadcasting is selected by the tuner 121. When the voltage to be supplied to the tuner comes to be the upper threshold value, the state of the flip-flop 117 is changed so that the charging/discharging control circuit 119 is controlled to be in the instantaneous charge mode. This makes the further tuning to be effected again from a lower frequency to a higher frequency upon manual operation of the switch 111.

Figure 2:
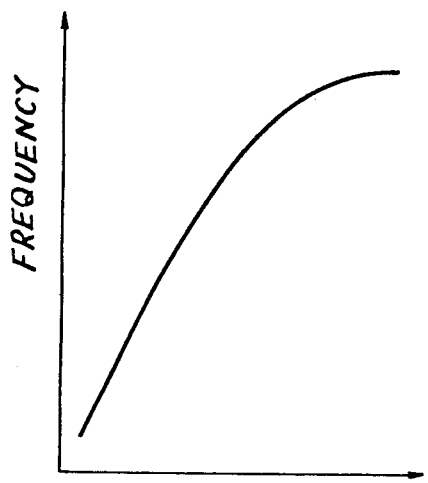
FIG. 2 is a graph showing a relation between the tuning frequency and the scanning voltage.

It is understood to those skilled in the art that the control voltage which is applied to the voltage controlled variable capacitance diode VC of the tuner 121 from the amplifier 114, and a frequency which the tuner 121 selects in response to the control voltage are in close relationship with each other. FIG. 2 is a graph showing such a relation between the tuning frequency in the tuner and the scanning control voltage supplied to the variable capacitance diode, in which the ordinate indicates the frequency and the abscissa indicates the scanning voltage. The FIG. 1 embodiment further comprises an indicator 118 for indicating the selected frequency by the use of the output from the amplifier 114. The indicator 118 comprises a plurality of light emitting diodes A, B, C . . . F arranged in a line, each illuminating the corresponding frequency indicating region output of a plurality of divided frequency indicating regions of the frequency band to be received by the receiver, said regions being arranged in succession to cover said frequency band, and a corresponding plurality of drivers (not shown) responsive to said control voltage for energizing the corresponding light emitting diode for illuminating the corresponding frequency region to which the tuned frequency pertains.

In the foregoing description, the FIG. 1 diagram has been described as embodied in an FM radio receiver. However, it is pointed out that the description given hereinabove can be applied to television receivers, and any other type of receivers under proper modifications which are obvious to those skilled in the art.

Operation Modes

In the foregoing, an FM radio receiver employing a typical automatic tuning apparatus using a well known voltage controlled variable capacitance diode has been described with reference to FIG. 1, in which the present invention can be advantageously embodied as to be more fully described subsequently. As briefly discussed previously, the present invention is aimed to provide an improved automatic tuning apparatus which enables a tuning operation of versatility, with a simplified circuit configuration and preferably in a form suited for integration by way of an integrated circuit. Such an improved automatic tuning apparatus will be described in the following.

Briefly stated, the present invention is aimed to provide an automatic tuning apparatus which enables various scanning operation modes, such as (1) a unidirectional scanning operation mode (upward scanning operation mode or downward scanning operation mode), (2) a bidirectional scanning operation mode, (3) a continued stop scanning operation mode, and (4) a temporary stop scanning operation mode, as specifically defined in the present specification. Therefore, before entering into the detailed description of the present invention, it is believed appropriate to provide a specific definition of the above described various scanning operation modes.

By the continued stop scanning operation mode is meant in the present specification the scanning operation mode in which when a broadcast wave is tuned by the automatic tuning apparatus during the scanning operation the scanning is stopped by the stop signal and the reception state is maintained until subsequent manual operation of the control circuit. On the other hand, by the temporary stop scanning operation mode is meant in the present specification the scanning operation mode in which when a broadcast wave is received during the scanning operation as a result of tuning to the frequency of the broadcast wave by the automatic tuning apparatus the scanning is stopped by the stop signal only for a given period of time to maintain the reception state but the scanning is started again automatically after the lapse of the abovementioned period of time.

By the upward scanning operation mode is meant in the present specification the scanning operation mode in which the scanning is effected in the direction toward a higher frequency but when the scanning voltage reaches the predetermined maximum value or the tuning frequency reaches the corresponding highest value the scanning is started again from the minimum voltage or the lowest frequency of the frequency range. On the other hand, by the downward scanning operation mode is meant in the present specification the scanning operation mode in which the scanning is effected in the direction toward a lower frequency but when the scanning voltage reaches the predetermined minimum value or the corresponding lowest frequency the scanning is started again from the highest frequency of the frequency range.

By the unidirectional scanning operation mode is meant in the present specification the scanning operation mode in which the scanning is effected in only one predetermined direction such as toward a higher frequency or toward a lower frequency and when the scanning voltage reaches the predetermined limit value the scanning is started again from the opposite limit value. On the other hand, the bidirectional scanning operation mode is meant in the present specification the scanning operation mode in which the scanning is effected in either direction, such as toward a higher frequency or toward a lower frequency, as desired, by manual operation of the control circuit.

For the purpose of facilitating the understanding of the following description, more detailed description will be made of the upward scanning and the downward scanning in association with the operation of the potential memory device. As described previously, in the upward scanning operation mode, the scanning is effected toward a higher frequency and, when the predetermined maximum frequency or the upper limit of the broadcasting frequency range is reached, the scanning is again effected starting from the lowest frequency toward a higher frequency. As is readily understood from the foregoing description, during this operation mode, the potential memory device is gradually discharged at a normal speed and accordingly, the capacitance across the variable capacitance diode becomes smaller (due to the effect of the gradually increased output voltage of the potential memory device circuit). This results in an increase in tuning frequency by the tuner, effecting scanning toward a higher frequency. Thereafter, upon the occurrence of the predetermined maximum scanning voltage or the corresponding highest frequency, the potential memory device is instantaneously charged so that the scanning voltage is instantaneously decreased to the minimum scanning voltage to reset the low to high scanning circles. Thereafter, the potential memory device is discharged again at normal speed (the scanning voltage is again gradually increased). Throughout the present specification, the discharging in the normal speed is referred to as "normal discharging" hereinafter and the charging in the instantaneous manner as described above is referred to as "instantaneous charging" hereinafter. If and when the tuning is completed during the scanning, the scanning operation mode is stopped by the stop signal to keep the scanning voltage unchanged thereafter and thus to achieve the reception state.

As described previously, in the downward scanning operation mode, the scanning is effected toward a lower frequency and, when the predetermined minimum frequency or the lower limit of the broadcasting frequency range is reached, the scanning is again effected starting from the highest frequency toward a lower frequency. As is readily understood from the foregoing description, during this operation mode, the potential memory device is gradually charged in a normal speed and accordingly, the capacitance across the variable capacitance diode becomes larger (due to the effect of gradually decreased output voltage of the potential memory device circuit). This results in a decrease of the tuning frequency by the tuner effecting scanning toward a lower frequency. Thereafter, upon the occurrence of the predetermined minimum scanning voltage or the corresponding lowest frequency, the potential memory device is instantaneously discharged so that the scanning voltage is instantaneously increased to the maximum scanning voltage to reset the high to low scanning cycle. Thereafter, the potential memory device is charged at normal speed (the scanning voltage is again gradually decreased). Throughout the present specification, the charging in the normal speed is referred to as "normal charging" hereinafter and the discharging in the instantaneous manner as described above is referred to as "instantaneous discharging" hereinafter. If and when the tuning is completed during the scanning, the scanning operation mode is stopped by the stop signal to keep the scanning voltage unchanged thereafter and thus to achieve the reception state.

In the foregoing description, various scanning operation modes were described, which are carried out by the embodiment shown in FIG. 1, which employs the solid state potential memory device disclosed in the previously referenced patent. However, it will be apparent that exactly the same scanning operation can be achieved by the automatic tuning apparatus which employs a capacitor as a potential storing device, which is combined with a control circuit for keeping the capacitor charged to a given selected terminal voltage thereof for compensating the inherent leakage of charge in the capacitor, besides the above described charging/discharging control circuit in the embodiment shown in FIG. 1. It is pointed out that the present invention also covers such a modification. However, the automatic tuning apparatus employing a capacitor is disadvantageous as compared with the embodiment shown in that the terminal voltage of the capacitor changes in an exponential manner, apart from the disadvantage of the inherent leakage of change of the capacitor.

Structure of the Embodiment

Figure 3:
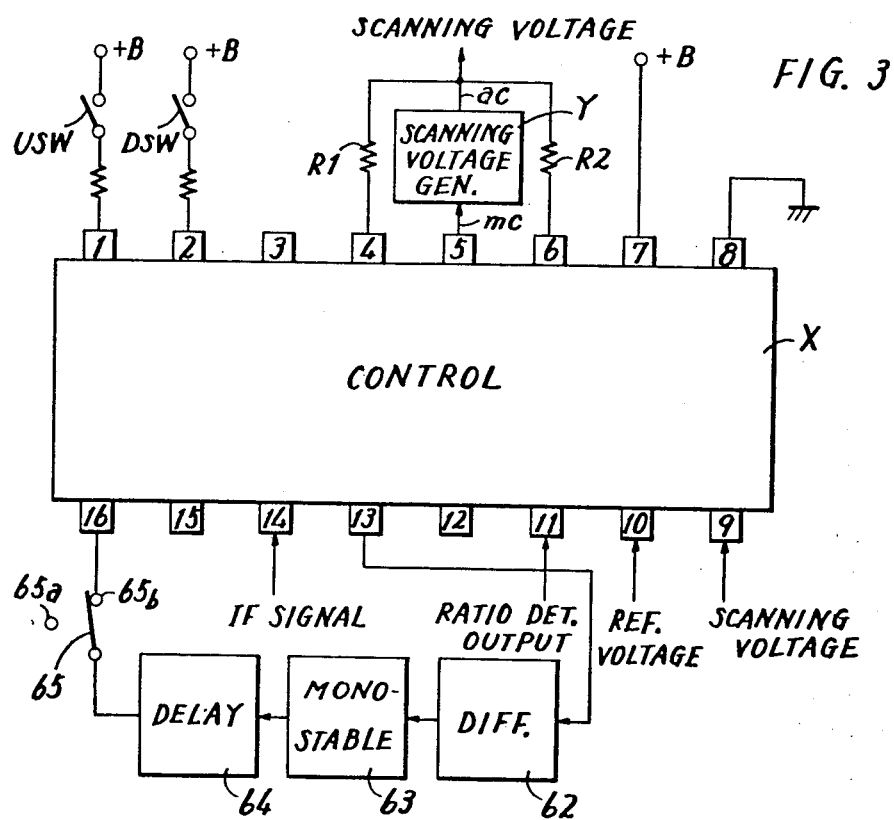
FIG. 3 is a block diagram showing an outline of an embodiment of the present invention.

FIG. 3 is a block diagram showing an outline of an embodiment of the present invention. The embodiment is shown as embodied in an FM radio receiver and a major portion of the embodiment has been implemented as a control circuit X in the form of an integrated circuit, as shown, to which several external components are connected to form the inventive automatic tuning apparatus.

More specifically, the control circuit X for controlling a scanning voltage generating circuit Y comprising the potential memory device (not shown in FIG. 3) is implemented by an integrated circuit of a well known dual-in-line type and having terminals 1 through 16. Of these, the terminals 1 and 2 are each connected through an upward scanning switch USW and a downward scanning switch DSW to the +B voltage source, each of which scanning switches is aimed to determine the direction of scanning and corresponds to the switch 111 in FIG. 1. The terminal 3 has been shown as not connected but is connected to the +B voltage source when the inventive automatic tuning apparatus is used only for the purpose of the upward scanning operation mode (unidirectional scanning) and otherwise is grounded. The scanning voltage generating circuit Y comprises a potential memory device therein corresponding to the block 113 in FIG. 1 and the terminal mc of the circuit Y corresponding to the main cathode of the potential memory device is connected to the terminal 5, while the output terminal ac of the circuit Y corresponding to the auxiliary cathode of the potential memory device is withdrawn as the scanning voltage to be applied to the variable capacitance diode in the tuner 121 in FIG. 1 and is also connected to the terminal 9 of the control circuit X. The output terminal ac of the circuit Y is also connected through compensation resistors R1 and R2 to the terminals 4 and 6, respectively, for the purpose of correcting or compensating the charging state or discharging state of the potential memory device, as to be more fully described subsequently. The terminal 7 is also connected to the +B voltage source, while the terminal 8 is grounded by way of the ground terminal of the circuit X. The terminal 10 is connected to be supplied with a reference voltage withdrawn from a voltage source (not shown) which voltage has been adjusted to be the same as the ratio detected output voltage in case of complete tuning by the tuner of the receiver, and the terminal 11 is connected to receive an output voltage from the ratio detector corresponding to the block 124 in FIG. 1. The terminal 14 is connected to receive the intermediate frequency signal obtainable from the intermediate frequency amplifier corresponding to the block 123 in FIG. 1. Accordingly, the apparatus can make judgement whether the tuner has been fully tuned to or detuned from a given broadcast wave by the use of the incoming signals from the terminals 11 and 14.

As more fully described subsequently, an output signal obtainable from the terminal 13, referred to as the scanning stop signal subsequently, is applied to a differentiation circuit 62. A differentiated output from the differentiation circuit 62 is applied as a trigger input to a monostable multivibrator 63, which provides a pulse of a predetermined pulse width in response to the trigger input. The output from the monostable multivibrator 63 is utilized to control a delay time of the signal from the delay circuit 64 and the output of the delay circuit 64 is connected to the terminal 16 through a switch 65 which is to enable the inventive automatic tuning apparatus to make the continued stop scanning operation or the temporary stop scanning operation, as specifically defined previously in the present specification.

The terminal 12 has been adapted to provide a disabling signal for disabling the scanning frequency indicator (not shown in FIG. 3), which corresponds to the block 118 in FIG. 1 and indicates the frequency being scanned or being tuned, which is, for example, implemented by dividing the full indicating area of the frequency range into several regions and by providing an emitting diode in each of the regions so that only one corresponding light emitting diode is lit to indicate the frequency being scanned, as described previously. If such an indicator or display is provided in the receiver, the indicator will be enabled even during the instantaneous charging or instantaneous discharging period, which can provide an unnecessary indication. The output obtainable from the terminal 12 is applied to the indicator to disable it and blank out the indication during such instantaneous charging or instantaneous discharging period. In FIG. 1 such disabling signal is shown as "DISABLE" adjacent to an arrow directed to the indicator 118. The terminal 15 has been adapted to provide a disabling signal for disabling the audio signal circuit only during the scanning operation. In FIG. 1 such disabling signal is shown as DISABLE adjacent to an arrow directed to the audio amplifier 126.

Figure 4:
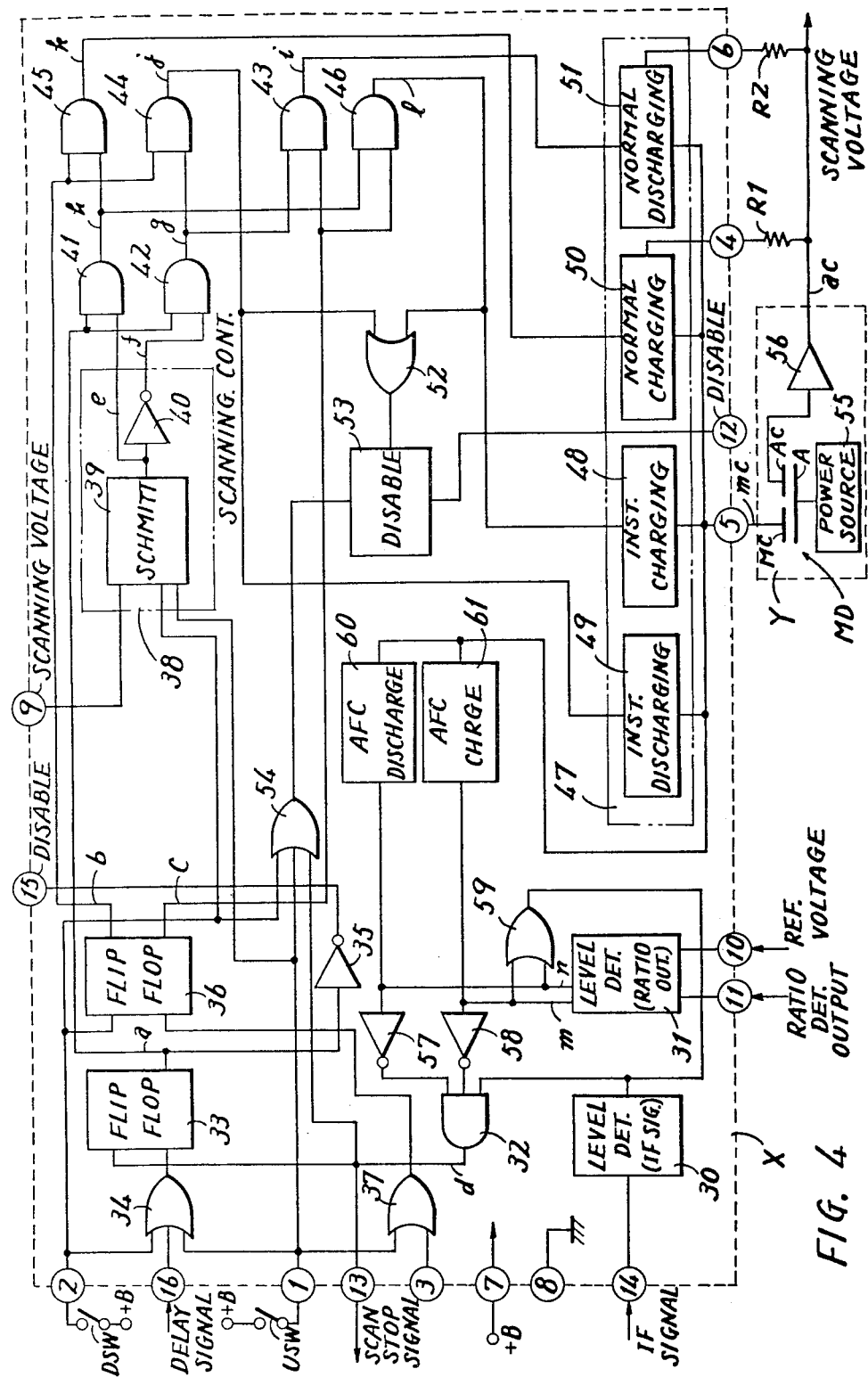
FIG. 4 is a more detailed block diagram of the FIG. 3 embodiment, FIG. 5 (5A, 5B and 5C) shows a schematic diagram of the FIGS. 3 and 4 embodiment.

FIG. 4 is a block diagram showing a more detailed schematic diagram of the control circuit X of the FIG. 3 embodiment. Further description will be made of the embodiment of the present invention with simultaneous reference to FIGS. 3 and 4. The high level signal supplied from the +B voltage source through the upward scanning switch USW and the terminal 1 is applied to one input of an OR gate 34 and one input of an OR gate 37 and is also applied to one input of an OR gate 54 and to an input of a Schmitt circuit 39 which constitutes a scanning control circuit 38. The high level signal supplied from the +B voltage source through a downward scanning switch DWS and the terminal 2 is applied to one input of the OR gates 34 and 54 and is also applied to a set input of a flip-flop 36 for storing the scanning direction and is also applied to the other input of the Schmitt circuit 39. Another input of the OR gate 34 is connected to receive the output from the delay circuit 64 through the terminal 16 and the switch 65 and the output from the OR gate 34 is applied to a reset input of the flip-flops 33 to store whether the apparatus is in a scanning operation or not. Another input of the OR gate 37 is connected to receive the high level signal of the +B voltage source potential or the low level signal of the ground potential, as selected as described previously, and the output of the OR gate 37 is applied to the reset input of the flip-flop 36.

The reset output a of the flip-flop 33 is applied to one input of each of AND gates 41 and 42 as a scanning control signal and is also applied to an inverter 35. An inverted output from the inverter 35 is withdrawn through the terminal 15 by way of the above described sound disabling signal. The set output b of the flip-flop 36 is applied to one input of each of AND gates 44 and 45 by way of a downward scanning signal. The reset output c of the flip-flop 36 is applied to one input of each of AND gates 43 and 46 by way of an upward scanning signal.

The above described Schmitt circuit 39 constituting the scanning control circuit 38 further receives from the terminal 9 the scanning voltage and the output e therefrom is applied to the other input of the AND gate 41. The output e is also applied to an inverter 40, which also constitutes the scanning control circuit 38, to provide an inverted output f, which is applied to the other input of the AND gate 42. The output h of the AND gate 41 is applied to the other input of the AND gates 45 and 46 and the output g of the AND gate 42 is applied to the other input of the AND gates 44 and 43. The outputs i, j, k and l of the AND gates 43, 44, 45 and 46, respectively, are applied to the charging/discharging control circuit 47 which corresponds to the block 119 in FIG. 1. More specifically, the output i of the AND gate 43 is applied to a normal discharging circuit 51, to control the potential memory device MD of the scanning voltage generating circuit Y to be in the normal discharging mode. Similarly, the output j of the AND gate 44 is applied to an instantaneous discharging circuit 49, the output k of the AND gate 45 is applied to a normal charging circuit 50, and the output l of the AND gate 46 is applied to an instantaneous charging circuit 48. The output j of the AND gate 44 (instantaneous discharging signal) and the output l of the AND gate 46 (instantaneous charging signal) are both applied to the inputs to an OR gate 52. The output from the OR gate 52 is applied to a disabling circuit 53 as a control signal input for disabling an output of the OR gate 54 which receives an output d from an AND gate 32 to be described subsequently. An output from the disabling circuit 53 is withdrawn from the terminal 12.

Each of the instantaneous discharging circuit 49, the instantaneous charging circuit 48, the normal charging circuit 50 and the normal discharging circuit 51 in the charging/discharging control circuit 47 is connected through the terminal 5 to the main cathode MC of the potential memory device MD to provide a charging/discharging control signal. The scanning voltage generating circuit Y is structured in substantially the same manner as in the blocks 113 and 114 in FIG. 1 and similarly comprises the potential memory device MD, a voltage source 55 for the memory device MD and a DC amplifier 56 for amplifying the output from the memory device MD. More specifically, the main cathode MC is connected to the terminal 5, the anode A is connected to the voltage source 55, and the auxiliary cathode AC is connected to the input of the amplifier 56. The operation of the potential memory device MD was fully described with reference to FIG. 1. The output from the amplifier 56 is withdrawn as the scanning voltage. The scanning voltage is applied to the terminal 9 and also to the variable capacitance diode in the tuner, as described previously.

When the scanning voltage is applied as described above, the tuning frequency of the tuner 121 is changed and accordingly the level of the intermediate frequency signal and the ratio detected output voltage are also changed. A level detection circuit 30 for level detecting the amplitude of the intermediate frequency signal (corresponding to the block 142 in FIG. 1) receives the intermediate frequency signal from the terminal 14 and the output therefrom is applied to one input of an AND gate 32. The level detection circuit 31 for level detecting the ratio detected output (corresponding to the block 125 in FIG. 1) receives the above described reference voltage from the terminal 10 as one input thereto and also receives the above described ratio detected output from the terminal 11 as another input thereto and provides two outputs m and n which are inverted by inverters 58 and 57, respectively, and applied to the remaining inputs to the AND gate 32. The said outputs m and n are also applied to the OR gate 59. The output d of the AND gate 32 is withdrawn through the terminal 13 by way of the scanning stop signal and is also applied to the input of the OR gate 54 as described previously and is also applied to the set input of the flip-flop 33.

The output n of the level detection circuit 31 is applied as a control input signal to an automatic frequency control discharging circuit 60 and the output m is applied as a control input signal to an automatic frequency control charging circuit 61. The outputs from these circuits 60 and 61 are applied to the terminal 5 and thus to the main cathode of the potential memory device MD in the scanning voltage generating circuit Y.

Figure 5A:
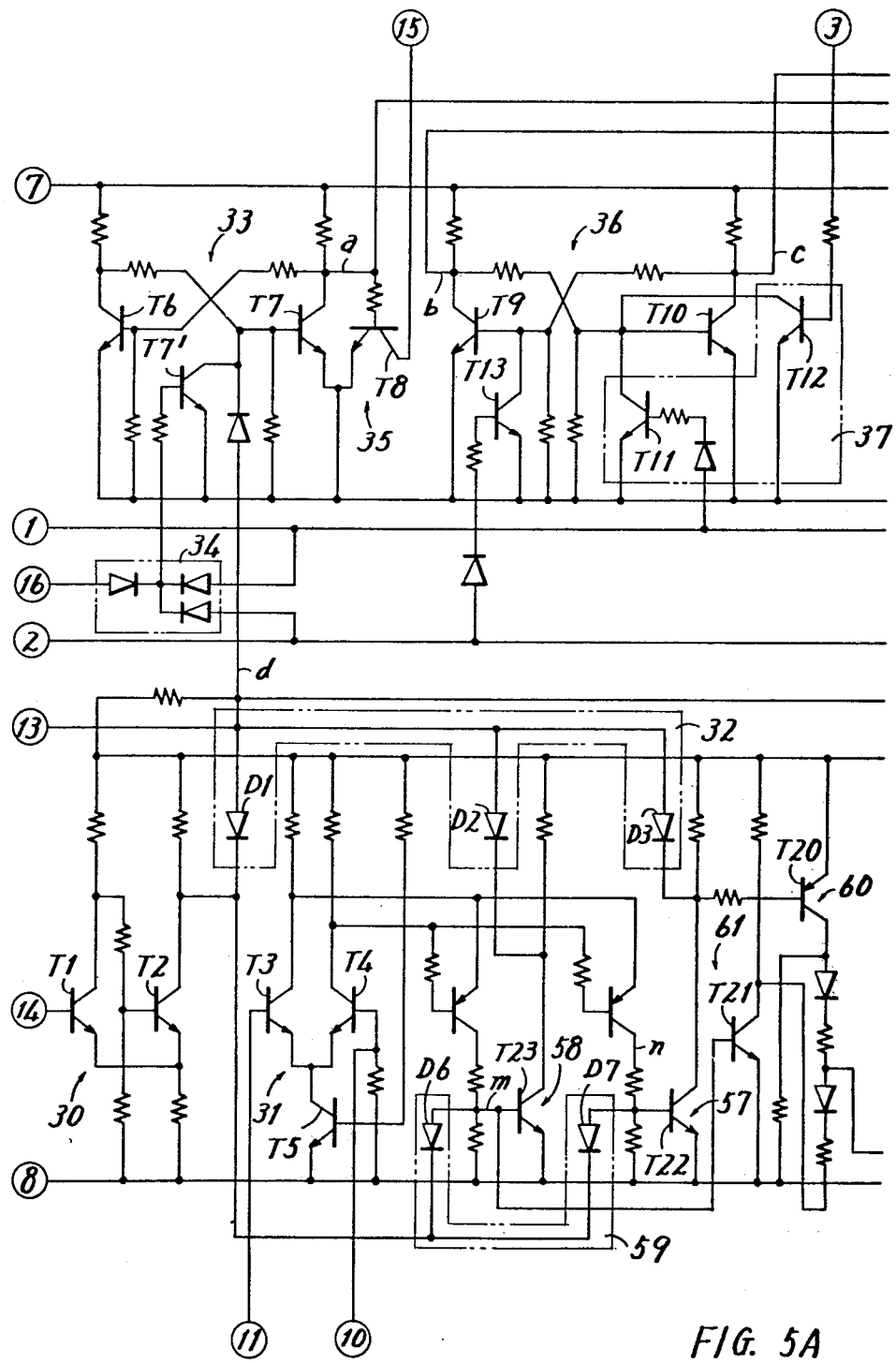
Figure 5B:
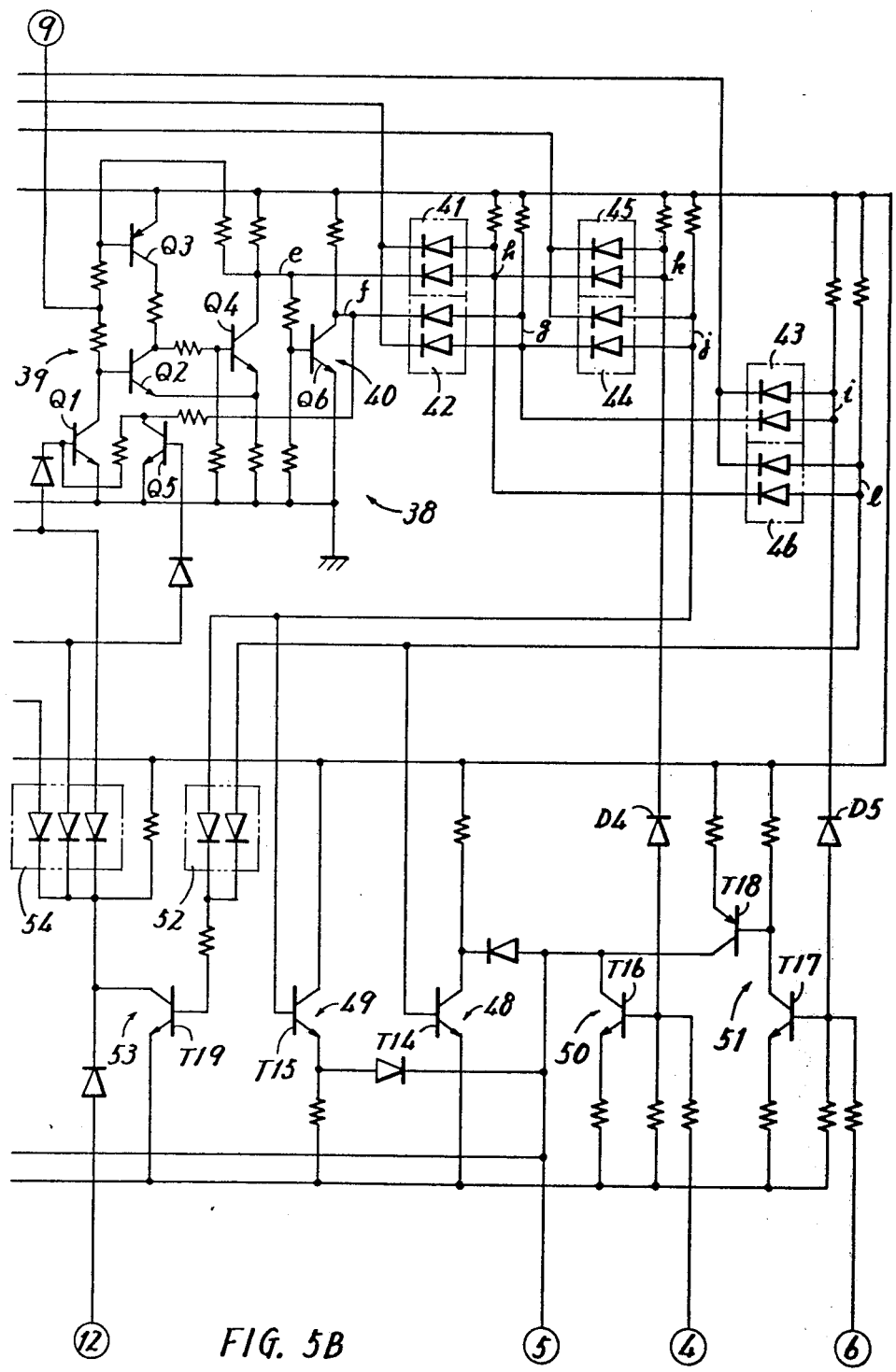

FIG. 5 (FIGS. 5A and 5B) is a schematic diagram showing in more detail the FIG. 4 embodiment. With simultaneous reference to FIGS. 3 through 5, description will be made of the detailed structure and the function of each portion of the embodiment shown.

The level detection circuit 30 for level detecting the intermediate frequency signal comprises a Schmitt circuit implemented by transistors T1 and T2, in which the intermediate frequency signal is applied from the terminal 14 to the base of the transistor T1. If and when the intermediate frequency signal reaches a predetermined level, the transistor T1 becomes conductive and accordingly the transistor T2 becomes non-conductive, so that the high level signal is obtained from the output of the circuit 30 (the collector of the transistor T2). The AND gate 32 is implemented by three diodes D1, D2 and D3. The collector of the transistor T2 is connected to the cathode of the diode D1 of the AND gate 32. The level detection circuit 31 for level detecting the ratio detected output comprises a differential amplifier, which is implemented by transistors T3, T4 and T5, the last mentioned transistor T5 serving as a constant current source. The reference voltage is applied from the terminal 10 to the base of the transistor T4 and the ratio detected output is applied from the terminal 11 to the base of the transistor T3. If and when the ratio detected output applied to the terminal 11 becomes equal to the reference voltage, both transistors T3 and T4 become similarly operative and therefore no output is obtained at the collectors of the transistors T3 and T4. More specifically, if and when the tuner of the receiver is tuned to the desired frequency, the difference between the reference voltage and the ratio detected output becomes smaller than the predetermined value, so that both outputs m and n of the level detection circuit 31 become the low level. On the contrary, if and when the reference voltage and the ratio detected output become imbalanced, either output m or n becomes the high level.

The outputs m and n of the level detection circuit 31 are applied to diodes D6 and D7 in the forward direction, respectively, which constitute the RO gate 59. The output m of the level detection circuit 31 is also applied to the base of a transistor T21 which constitutes the automatic frequency control charging circuit 61 so as to control the conduction of the transistor T21. Similarly, the output n of the level detection circuit 31 is applied to the base of the transistor T20 which constitutes the automatic frequency control discharging circuit 60 so as to control the conduction of the transistor T20. The output m is inverted by the inverter 58 implemented by a transistor T23 and the inverted output obtainable from the collector thereof is applied to the cathode of the diode D2 constituting the AND gate 32. Similarly, the output n is inverted by the inverter 57 implemented by a transistor T22 and the inverted output obtainable from the collector thereof is applied to the cathode of the diode D3 constituting the AND gate 32.

As described previously, the AND gate 32 is implemented by three diodes D1, D2 and D3, the anodes of these diodes being commonly connected to form the output of the AND gate 32. If and when the input to the diode D1 (the output from the circuit 30 and the output from the OR gate 59), the input to the diode D2 (the output from the inverter 58) and the input to the diode D3 (the output from the inverter 57) all become the high level, the output d of the high level is obtained at the output terminal of the AND gate 32. More specifically, if and when the intermediate frequency signal exceeds the predetermined level, and the difference between the reference voltage and the ratio detected output becomes smaller than the predetermined level (the tuner is tuned to the desired frequency), the output d of the high level is obtained from the AND gate 32. The output d from the AND gate 32 is applied to the set input of the flip-flop 33 (the base of the transistor T7 to be described subsequently).

The OR gate 34 comprises three diodes, the cathodes of which are commonly connected to form the output terminal of the OR gate 34. The anode of one diode is connected to receive the signal from the terminal 1, the anode of another diode is connected to receive the signal from the terminal 2, and the diode of still another diode is connected to receive the signal from the terminal 16, so that if and when at least any of these signals becomes the high level an output of the high level is obtained at the output terminal of the OR gate 34 (the common connected cathodes of the diodes). The output of the OR gate 34 is applied to the reset input of the flip-flop 33 (the base of the transistor T7' to be described subsequently).

The flip-flop 33 for storing whether the scanning is progressing or the scanning is stopped is implemented by transistors T6, T7 and T7' so as to be a type of reset priority, i.e. a type of flip-flop in which the reset state is caused in response to the reset input in preference to the set input when the set and reset inputs are received at the same time. The set input (the output d from the AND gate 32) is received by the base of the transistor T7 and the reset input (the output from the OR gate 34) is received by the base of the transistor T7'. If and when the output d of the high level from the AND gate 32 is received, the transistor T7 becomes conductive, so that the potential at the collector of the transistor T7 (the reset output a of the flip-flop 33) becomes the low level. On the contrary, if and when the output of the high level from the OR gate 34 is received, the transistor T7' becomes conductive and the transistor T7 is turned off, so that the collector potential of the transistor T7 (the reset output a of the flip-flop 33 becomes the high level). If and when the output d from the AND gate 32 and the output from the OR gate 34 become the high level at the same time, then the transistor T7' becomes conductive, so that the transistor T7 is turned off to provide the high level output at the reset output terminal a, thereby to perform a flip-flop operation of reset priority. Thus, if and when the output from the OR gate 34 becomes the high level, i.e. either the upward scanning switch USW or the downward scanning switch DSW is closed, or if and when the output from the delay circuit 64 is received, the reset output a of the high level is obtained, which indicates that the scanning is being effected. On the contrary, if and when the output d from the AND gate 32 becomes the high level, i.e. the tuner of the receiver is tuned to the desired frequency of the broadcast wave, then the flip-flop 33 is set and the reset output a becomes the low level, which indicates that the scanning is stopped. The reset output a of the flip-flop 33 is applied to one input of each of the AND gates 41 and 42 to be more fully described subsequently.

The inverter 35 comprises a transistor T8 and inverts the reset output a of the flip-flop 33 to provide the inverted output at the terminal 15 as the audio disabling signal. Thus, the audio disabling signal becomes the low level, when the reset output a of the flip-flop 33 becomes the high level, i.e. during the scanning operation period, and this low level of the audio disabling signal serves to disable the audio signal during the scanning operation period.

The flip-flop 36 for storing whether the automatic tuning apparatus is in the upward scanning operation mode or the downward scanning operation mode is implemented by transistors T9 and T10. The OR gate 37 is implemented by transistors T11 and T12. Assuming that the upward scanning switch USW is closed, then the high level signal of the +B potential is applied from the terminal 1 to the OR gate 37, so that the transistor T11 becomes conductive and accordingly the transistor T9 is turned on and the transistor T10 is turned off. As a result, the output c of the flip-flop 36 becomes the high level which indicates the upward scanning period. Likewise, if and when the high level signal is obtained at the terminal 3, the transistor T12 becomes conductive, and accordingly the transistor T9 is turned on and the transistor T10 is turned off, so that the output c becomes the high level. On the other hand, assuming that the downward scanning switch DSW is closed, the high level signal of the +B voltage source potential is applied from the terminal 2 to the flip-flop 36, so that the transistor T13 becomes conductive and accordingly the transistor T10 is turned on and the transistor T9 is turned off. As a result, the output b of the flip-flop 36 becomes the high level, which indicates the downward scanning period. In short, the flip-flop 36 provides the high level output at the output terminal c when the upward scanning switch USW is closed and the high level output at the output terminal b when the downward scanning switch DSW is closed. The output c of the flip-flop 36 is applied to one input of the AND gates 43 and 46 and the output b of the flip-flop 36 is applied to one input of the AND gates 44 and 45, as to be described subsequently.

The scanning control circuit 38 comprises the Schmitt circuit 39 implemented by transistors Q1 and Q5, combined with an upper threshold detector implemented by a transistor Q3 and a lower threshold detector implemented by a transistor Q2, and the invertor 40 implemented by a transistor Q6. The high level signal obtainable from the terminal 1 when the upward scanning switch USW is closed is applied to the base of the transistor Q1 and the high level signal obtainable from the terminal 2 when the downward scanning switch DSW is closed is applied to the base of the transistor Q5, while the scanning voltage obtainable from the scanning voltage generating circuit Y through the terminal 9 is applied to the bases of the transistors Q2 and Q3 through the respective proper resistors. The transistor Q2 constituting the lower threshold detector is biased such that it is normally conductive but is turned off when the scanning voltage supplied from the terminal 9 reaches the predetermined lower threshold value or the predetermined minimum value, and the transistor Q3 constituting the upper threshold detector is biased such that it is normally conductive but is turned off when the scanning voltage reaches the predetermined upper threshold value or the predetermined maximum value. In the following description will be made of the operation of the scanning control circuit 38 in various situations.

1. In Case Where the Upward Scanning Switch USW is Closed

If and when the upward scanning switch USW is closed, the high level signal of the +B voltage source potential is applied through the terminal 1 to the base of the transistor Q1, whereby the transistor Q1 becomes conductive. The scanning voltage obtainable through the terminal 9 is applied to the bases of the transistors Q2 and Q3, but since the transistor Q1 is conductive, the transistor Q2 constituting the lower threshold detector is turned off, while the other transistor Q3 is turned on. Accordingly, the transistor Q4 is biased in the conduction direction, so that the transistor Q4 becomes conductive and the transistor Q6 becomes non-conductive. Therefore, the output e at the collector of the transistor Q4 becomes the low level while the output f at the collector of the transistor Q6 becomes the high level.

2. In Case Where the Downward Scanning Switch DSW is Closed

If and when the downward scanning switch DSW is closed, the high level signal of the +B voltage source potential is applied through the terminal 2 to the base of the transistor Q5 to raise the base potential thereof, so that the transistor Q5 becomes conductive and accordingly the transistor Q1 becomes non-conductive. As described previously, the scanning voltage is applied through the terminal 9 to the bases of the transistors Q2 and Q3. Therefore, both transistors Q2 and Q3 become conductive, and accordingly the transistor Q4 is not biased in the conduction direction. As a result, the transistor Q4 becomes non-conductive, and the transistor Q6 becomes conductive. Therefore, the output e at the collector of the transistor Q4 becomes the high level and the output f at the collector of the transistor Q6 becomes the low level.

3. In Case Where the Scanning Voltage Reaches the Maximum Value

If and when the scanning voltage obtainable through the terminal 9 reaches the maximum value, the transistor Q3 comes to be biased in the reverse direction, so that the transistor Q3 is turned off. Accordingly, the transistor Q4 is not biased in the conduction direction, so that it is turned off and accordingly the transistor Q6 becomes conductive. In such a situation, the output e becomes the high level and the output f becomes the low level.

4. In Case Where the Scanning Voltage Reaches the Minimum Value

If and when the scanning voltage obtainable from the terminal 9 reaches the minimum value, the transistor Q2 comes to be biased in the reverse direction, so that the transistor Q2 becomes non-conductive. Since the other transistor Q3 has been conductive, the transistor Q4 is biased in the conduction direction, so that the transistor Q4 becomes conductive and accordingly the transistor Q6 becomes non-conductive. In such situation, the output $e$ becomes the low level and the output $f$ becomes the high level.

The AND gate 41 comprises two diodes, the anodes of which are commonly connected to form the output terminal of and AND gate 41. The cathode of the diode is connected from the reset output $a$ of the flip-flop 33 and the cathode of the other diode is connected from the output $e$ of the scanning control circuit 38. When both outputs $a$ and $e$ are obtained simultaneously, the output $h$ of the commonly connected anode of the diodes becomes the high level. More specifically, the output $h$ of the AND gate 41 becomes the high level, if and when the apparatus is in the scanning operation mode (the reset output $a$ of the flip-flop 33 is in the high level), and the scanning is being made in the downward direction or the scanning voltage reaches the maximum value (in either case the output $e$ of the control circuit 47 becomes the high level), and the output $h$ of the high level thus obtained from the AND gate 41 is applied to the AND gate 45 and 46 to be described subsequently. The AND gate 42 comprises two diodes, the anodes of which are commonly connected to form the output terminal thereof. More specifically, the cathode of one diode is connected from the output $a$ of the flip-flop 33 and the cathode of the other diode is connected from the output $f$ of the scanning control circuit 38 and the output $g$ of the commonly connected anode of the diode of the AND gate 42 becomes the high level when both outputs $a$ and $f$ becomes high level. Accordingly, the output $g$ from the AND gate 42 becomes the high level, only if and when the apparatus is in the scanning operation mode (the output $a$ of the flip-flop 33 is in the high level), and the scanning is being made in the upward direction or the scanning voltage reaches the minimum value (the output $f$ is the high level). The output $g$ of the high level from AND gate 42 is applied to the AND gate 43 and 44 to be described subsequently.

The AND gate 43 comprises two diodes, the anodes of which are commonly connected to form the output terminal thereof. The cathode of one diode is connected from the output $c$ of the flip-flop 36 and the cathode of the other diode is connected from the output $g$ of the AND gate 42. Accordingly, the output $i$ of the AND gate 43 becomes the high level, only if and when the scanning is being made in the upward direction (the output $c$ is the high level) and the output $g$ from the AND gate 42 is the high level. The above described output $i$ of the high level is applied to the normal discharging circuit 51 of the charging/discharging control circuit 47. The AND gate 44 is implemented by two diodes, the anodes of which are commonly connected to form the output terminal therefrom. More specifically, the cathode of one diode is connected from the output $b$ of the flip-flop 36 and the cathode of the other diode is connected from the output $g$ of the AND gate 42, so that the output $j$ of the high level is obtained from the commonly connected anode when both outputs $b$ and $g$ become the high level. Accordingly, the output $j$ of the AND gate 44 becomes the high level, only if and when the scanning is being made in the downward direction (the output $b$ is the high level) and the output $g$ from the AND gate 42 is the high level. The output $j$ of the high level is applied to the instantaneous discharging circuit 49 of the charging/discharging control circuit 47 and is also applied to the OR gate 52 to be described subsequently.

The AND gate 45 comprises two diodes, the anodes of which are commonly connected to form the output terminal thereof. The cathode of one diode is connected from the output $b$ of the flip-flop and the cathode of the other diode is connected from the output $h$ of the AND gate 41. Accordingly, the output $k$ of the AND gate 45 becomes the high level, only if and when the scanning is being made in the downward direction (the output $b$ is the high level) and the output $h$ from the AND gate 41 is the high level. The above described output $k$ of the high level is applied to the normal charging circuit 50 of the charging/discharging control circuit 47. The AND gate 46 is implemented by two diodes, the anodes of which are commonly connected to form the output terminal therefrom. More specifically, the cathode of one diode is connected from the output $c$ of the flip-flop 36 and the cathode of the other diode is connected from the output $h$ of the AND gate 41, so that the output $l$ of the high level is obtained from the commonly connected anode when both outputs $c$ and $h$ become the high level. Accordingly, the output $l$ of the AND gate 46 becomes the high level, only if and when the scanning is being made in the upward direction (the output $c$ is the high level) and the output $h$ from the AND gate 41 is the high level. The output $l$ of the high level is applied to the instantaneous discharging circuit 48 of the charging/discharging control circuit 47 and is also applied to the OR gate 52 to be described subsequently.

Now, description will be made of the charging/discharging control circuit 47 for controlling the charging or discharging of the potential memory device MD in the scanning voltage generating circuit Y so as to cause the scanning in the upward direction or the downward direction with the scanning voltage. The output of the control circuit 47 is connected through the terminal 5 to the main cathode MC of the potential memory device MD for providing the scanning voltage, such that the charging or the discharging of the potential memory device MD is conntrolled by the output of the control circuit 47 so as to effect the upward or the downward scanning by the scanning voltage.

The instantaneous charging circuit 48 comprises a transistor T14, the base of which is connected from the output $l$ of the AND gate 46. When the output $l$ of the AND gate 46 becomes the high level, the transistor T14 becomes conductive, so that a current (charging current) flows from the power source 55 through the potential memory device MD, the terminal 5 and the trnsistor T14 to the ground, whereby the potential memory device is instantaneouly charged. The circuit concerned has been designed such that the value of the instantaneous charging current is much larger than the current value in case of the normal charging to be described subsequently, whereby the output voltage obtainable from the auxilialy cathode AC of the potential memory device MD becomes lower instantaneously. Thus it is seen that the scanning voltage obtainable from the scanning voltage generating circuit Y decreases instantaneously if and when the instantaneous charging circuit 48 is enabled by the output $l$ of the high level from the AND gate 46.

The instantaneous discharging circuit 49 comprises a transistor T15, the base of which is connected from the output $j$ of the AND gate 44. Accordingly, when the output $j$ of the AND gate 44 becomes the high level, the transistor T15 becomes conductive, so that a current (discharging current) flows from the +B voltage source through the transistor T15, a diode inserted in the forward direction and through the potential memory device MD, whereby the potential memory device MC is instantaneously discharged. The circuit concerned has been designed such that the value of the instantaneous discharging current is much larger than the normal discharging current, whereby the output voltage of the potential memory device MD is instantaneously increased. Thus it is seen that the scanning voltage obtainable from the scanning voltage generating circuit Y is instantaneously increased, only if and when the instantaneous discharging circuit 49 is enabled by the output j of the high level of the AND gate 44.

The normal charging circuit 50 comprises a transistor T16, the base of which is connected through a diode D4 from the output k of the AND gate 45. The base of the transistor T16 is also connected through the terminal 4 and the compensation resistor R1 to the output of the scanning voltage generating circuit Y. If and when the output k of the AND gate 45 is the low level, the diode D4 is biased in the forward direction, so that the transistor T16 is turned off, but if and when the output k of the AND gate 45 becomes the high level, the diode D4 is biased in the reversed direction, so that the diode D4 is turned off. Accordingly, the transistor T16 becomes conductive by the scanning voltage obtainable from the terminal 4, so that a current (charging current) flows from the power source 55 through the potential memory device MD, the terminal 5 and the transistor T16 to the ground, with the result that the potential memory device MD is placed in the normal charging state. It is seen from the above described characteristic curve of the tuner shown in FIG. 2 that the higher the scanning voltage becomes, the smaller the rate of change in the tuning frequency becomes. Moreover, in the embodiment shown, the higher the scanning voltage becomes, the smaller the internal impedance of the transistor T16 as a function of the scanning voltage applied thereto and accordingly the larger the charging current flows, whereby the scanning voltage is decreased more rapidly. It is pointed out that the circuit concerned has been designed such that the value of the charging current in case of the normal charging operation is much smaller as compared with the value of the above described instantaneous charging current, even if the normal charging current becomes larger. Thus, the scanning voltage obtainable from the scanning voltage generating circuit Y gradually decreases only if and when the normal charging circuit 50 is enabled by the output k of the high level from the AND gate 45.

The normal discharging circuit 51 comprises transistors T17 and T18, the base of the former connected through a diode D5 from the output i of the AND gate 43. The base of the transistor T17 is also connected through the terminal 6 and the compensation resistor R2 to the output of the scanning voltage generating circuit Y. If and when the output i of the AND gate 43 is a low level, the diode D5 is biased in the forward direction, so that the transistor T17 is turned off, but if and when the output i of the AND gate 43 becomes the high level, the diode D5 is biased in the reversed direction, so that the diode D5 is turned off. Accordingly, the transistors T17 and T18 become conductive by the scanning voltage obtainable from the terminal 6, so that a current (discharging current) from the power source +B flows from emitter of the said transistor T18 through the collector thereof to said memory device MD, with the result the potential memory device MD is placed in the normal discharging state. It is seen from the above described characteristic curve of the tuner shown in FIG. 2 that the higher the scanning voltage becomes, the smaller the rate of change in the tuning frequency becomes. Moreover, in the embodiment shown, the higher the scanning voltage becomes, the smaller the internal impedance of the transistor T17 as a function of the scanning voltage applied thereto and accordingly the larger the discharging current flows, whereby the scanning voltage is increased more rapidly. It is pointed out that the circuit concerned has been designed such that the value of the discharging current in case of the normal discharging operation is much smaller as compared with the value of the above described instantaneous discharging current, even if the normal discharging current becomes larger. Thus, the scanning voltage obtainable from the scanning voltage generating circuit Y gradually increases only if and when the normal discharging circuit 51 is enabled by the output i of the high level from the AND gate 43.

The OR gate 52 is implemented by two diodes, the cathode of which are commonly connected to form the output therefrom. The anode of one diode is connected from the output j of the AND gate 44 and the anode of the other diode is connected from the output l of the AND gate 46, while the output from the commonly connected cathode of the diodes of the OR gate is connected to the disabling circuit 53 to be described subsequently.

The OR gate 54 comprises three diodes the cathodes of which are commonly connected to form the output therefrom. The anode of one diode is connected from the output d of the AND gate 32, the anode of another diode is connected from the terminal 2 and the anode of still another diode is connected from the terminal 1, while the output of the commonly connected cathode of the diodes of the gate 54 is connected through the disabling circuit 53 to the terminal 12 to provide the above described indicator disabling signal.

The above described disabling circuit 53 comprises a transistor T19 connected between the signal line and the ground. More specifically, the output of the OR gate 52 is connnected to the base of the transistor T19, while the output of the OR gate 54 is connected to the collector of the transistor T19 and is also connected through a diode in the reverse direction to the terminal 12, the emitter of the transistor T19 being grounded. Accordingly, if and when the output of the OR gate 52 becomes the high level, i.e. either the output j of the AND gate 44 becomes the high level or the output l of the AND gate 46 becomes the high level (which means the apparatus is in either the instantaneous charging operation mode or the instantaneous discharging operation mode), the transistor T19 become conductive, so that the output from the OR gate 54 is grounded, whereby the output from the OR gate 54 is disabled to provide the low level output from the terminal 12, only if the output from the OR gate 52 becomes the high level. The output of the low level obtainable from the terminal 12 is utilized as the indicator disabling signal in order to disable the indicator. As a result, the disabling circuit 53 serves to disable the indicating operation of the indicator (FIG. 1) during the instantaneous charging or instantaneous discharging operation period.

The automatic frequency control charging circuit 61 operable in response to the output $m$ of the level detection circuit 31 comprises a transistor T21, and the automatic frequency control discharging circuit 60 operable in response to the output $n$ of the level detection circuit 31 comprises a transistor T20. More specifically, the base of the transistor T21 is connected from the output $m$ of the circuit 31 and the collector thereof is connected through a diode (in the reverse direction) and a proper resistor to the terminal 5, while the emitter is grounded. The base of the transistor T20 is connected from the output $n$ of the circuit 31, and the collector thereof is connected through a diode (in the forward direction) and a proper resistor to the terminal 5, while the emitter thereof is connected to the +B voltage source. It is pointed out that the detailed description will be made subsequently of the operation of the automatic frequency control charging circuit 61 and the automatic frequency control discharging circuit 60.

In the foregoing detailed description was made of the structure and the function of the respective portions in the control circuit X with particular reference to FIGS. 5A and 5B. In the following, therefore, description will be made of several portions, such as the differenciation circuit 62, the monostable multivibrator 63, and the delay circuit 64 with particular reference to FIG. 5C.

Operation of the Apparatus

Now that the circuit configuration of the whole system of the present invention has been fully described, various operation modes of the system of the present invention will be described in the following. As seen from the foregoing description, it is contemplated that the unidirectional scanning mode and the bidirectional scanning mode described how the scanning is effected throughout the full range of the frequency band to be received by the receiver, while the continued stop scanning mode and the temporary stop scanning mode describe how the automatic tuning apparatus responds to receipt of the broadcast wave when the broadcast is received by the receiver during the scanning. Therefore, the unidirectional scanning mode and the bidirectional scanning mode will be first described with reference to FIGS. 3 to 7. It is pointed out that in the description of these two modes, unidirectional scanning and bidirectional scanning, it is assumed that no broadcasting wave is broadcast in the receiving area and therefore no broadcast wave is received throughout the frequency band to be received, for facility of understanding of the operation. Thereafter, the other two scanning modes, the continued stop scanning and temporary stop scanning, will be described, on the assumption that a broadcasting wave has been broadcast in the receiving area.

1. Unidirectional Scanning Mode a. Upward Scanning Mode (FIG. 7(a))

Let it be assumed that as an initial condition the tuner of the receiver has been tuned to the lowest frequency in the frequency band, i.e. the scanning voltage has been the minimum value. When the upward scanning switch USW is closed, the high level signal is applied to the terminal 1 from the +B voltage source through the closed switch USW. The high level signal is applied to the base of the transistor T7', of the flip-flop 33 through one diode of the OR gate 34, so that the transistor T7 is turned off and the reset output $a$ becomes the high level. At the same time the transistor T11 of the OR gate 37 becomes conductive, and the transistor T10 of the flip-flop 36 is turned off, so that the output $c$ becomes the high level.

The high level signal from the terminal 1 is also applied to the transistor Q1 of the scanning control circuit 38. Therefore, the outputs $e$ and $f$ of the scanning control circuit 38 become the low level and the high level, respectively, as is clear from the foregoing description as to the circuit 38.

The high level output $a$ of the flip-flop 33 is inverted by the transistor T8 of the inverter 35 to become the low level signal, which is withdrawn through the terminal 15 as the audio disabling signal and is applied to the audio amplifier 126 of FIG. 1 to disable it, so that no sound is produced from the speaker 127.

Since the output of $a$ the flip-flop 33 and the output $f$ of the scanning control circuit 38 are the high level, the AND gate 42 receiving these outputs as inputs thereto provides a high level output $g$, and accordingly the AND gates 44 and 43 in the subsequent stage are enabled. On the other hand the output $c$ of the flip-flop 36 has been the high level, as described previously. As a result, the high level output $i$ is obtained from the AND gate 43.

The high level output $i$ of the AND gate 43 is applied to the cathode of the diode D5 of the normal discharging circuit 51 in the charging/discharging control circuit. Therefore, the potential memory device MD of the scanning voltage generating circuit Y is placed in the normal discharging state, as is clear from the previous description as to the circuit 51, and thus the scanning voltage is gradually increased as shown in FIG. 7(a). The gradually increasing scanning voltage is applied to the tuner 121 in FIG. 1, and accordingly the tuning frequency of the tuner 121 is gradually raised.

If and when the scanning voltage reaches the maximum value or the tuning frequency reaches the upper limit of the receiving frequency band as a result of the upward scanning, the outputs $e$ and $f$ of the scanning control circuit 38 are reversed to be the high level and the low level, respectively, and accordingly, the output $g$ from the AND gate 42 becomes the low level, while the output $h$ from the AND gate 41 becomes the high level. Therefore, the output $i$ of the AND gate 43 becomes the low level and the output $l$ of the AND gate 46 becomes the high level.

The high level output $l$ from the AND gate 46 is applied to the base of the transistor T14 of the instantaneous charging circuit 48 in the charging/discharging control circuit 47. Therefore, the potential memory device MD in the scanning voltage generating circuit Y is placed in the instantaneous charging state, as is clear from the previous description as to the circuit 48, and the scanning voltage is instantaneously lowered, as shown in FIG. 7(a). The instantaneously decreasing scanning voltage is applied to the tuner 121 and the tuning frequency of the tunner 121 is also lowered instantaneously.

As described above, the scanning voltage is instantaneously lowered and comes to reach again the minimum value. As a result, the tuner is tuned to the lower limit frequency in the receiving frequency band. The minimum value of the scanning voltage is detected by the lower threshold detector Q2 and therefore the scanning control circuit 38 and the charging/discharging circuit 47 control the scanning voltage generating circuit Y to effect again the normal discharging. As a result, the upward scanning operation mode by way of the unidirectional scanning is achieved, as shown in FIG. 7(a).

b. Downward Scanning Mode (FIG. 7(b))

Let it be assumed that the tuner of the receiver has been tuned to the maximum frequency in the receiving frequency band, i.e. the scanning voltage has reached the maximum value, by way of an initial condition. If and when the downward scanning switch DSW is closed, the high level signal is applied from the +B voltage source through the closed switch DSW and the terminal 2 and further through the OR gate 34 to the transistor T7' of the flip-flop 33. As a result, the flip-flop 33 is reset and the reset output $a$ becomes the high level. As in the same manner as described previously in connection with the upward scanning, the low level signal is withdrawn through the terminal 15 by way of the sudio disabling signal. Since the flip-flop 36 is set this time, the output $b$ becomes the high level and therefore the outputs $e$ and $f$ of the scanning control circuit 38 becomes the high level and the low level, respectively.

Therefore, the output $h$ of the AND gate 41 becomes the high level and the output $k$ of the AND gate 45 becomes the high level. The high level output $k$ of the AND gate 45 is applied to the normal charging circuit 50 of the charging/discharging control circuit 47, so that the potential memory device MD of the scanning voltage generating circuit Y is placed in the normal charging state and the scanning voltage is gradually decreased as shown in FIG. 7(b). Accordingly, the tuning frequency of the tuner in the receiver is also gradually lowered.

If and when the scanning voltage reaches the minimum value or the tuning frequency reaches the lower limit of the receiving frequency band as a result of the downward scanning, the outputs $e$ and $f$ of the scanning control circuit 38 are reversed to be the low level and the high level, respectively, and accordingly the output $h$ from the AND gate 41 becomes the low level, while the output $g$ from the AND gate 41 becomes the high level. Therefore, the output $k$ of the AND gate 45 becomes the low level and the output $j$ of the AND gate 44 becomes the high level.

The high level output $j$ from the AND gate 44 enables the instantaneous discharging circuit 49 in the charging/discharging control circuit 47. Therefore, the potential memory device MD in the scanning voltage generating circuit Y is placed in the instantaneous discharging state, and the scanning voltage is instantaneously increased, as shown in FIG. 7(b). The instantaneously increasing scanning voltage is applied to the tuner 121 and the tuning frequency of the tuner 121 is also raised instantaneously.

As described above, the scanning voltage is instantaneously increased and comes to reach again the maximum value. As a result, the tuner is tuned to the upper limit frequency in the receiving frequency band. The maximum value of the scanning voltage is detected by the upper threshold detector Q3 and therefore the scanning control circuit 38 and the charging/discharging circuit 47 control the scanning voltage generating circuit Y to effect again the normal charging. As a result, the downward scanning operation mode by way of the unidirectional scanning is achieved, as shown in FIG. 7(b).

Now, operation of the disabling circuit 53 is described. As described previously, the disabling circuit 53 is aimed to disable the indicating operation of the indicator 118 in FIG. 1 during the instantaneous charging or the instantaneous discharging period, whereby undesired indication is prevented from being viewed during such period. More specifically, either the output $l$ of the AND gate 46 or the output $j$ of the AND gate 44 becomes the high level during the instantaneous charging or the instantaneous discharging, and accordingly the output from the OR gate 52 receiving these outputs $l$ and $j$ becomes the high level. The high level output from the OR gate 52 makes the transistor T19 of the disabling circuit 53 be conductive, so that the collector thereof and thus the terminal 12 is caused to be the ground potential or the low level. As a result, during the instantaneous charging or the instantaneous discharging period, the potential of the terminal 12 cannot be the high level, i.e. the output from the disabling circuit becomes the low level, which is utilized to disable the operation of the indicator.

Another function of the disabling circuit 53 is to disable the input signal by manual operation of the upward scanning switch USW and the downward scanning switch DSW as well as the inputting of the scanning stop signal to the flip-flop 33 during the instantaneous charging or the instantaneous discharging, whereby the charging/discharging control circuit 47 is prevented from being disabled by the input signal by the closing of the switch USW or DSW as well as the scanning stop signal obtainable at the terminal 13. More specifically, if and when either the upward scanning switch USW or the downward scanning switch DSW is closed or the scanning stop signal is obtained (the output $d$ of the ANd gate 32 becomes the high level), the output of the OR gate 54 becomes the high level. However, as described previously, the transistor T19 of the disabling circuit 53 is turned on during the instantaneous charging or the instantaneous discharging, so that the high level output of the OR gate 54 is forced to be the low level or the ground potential. As a result, depression or closing of the upward scanning switch USW or the downward scanning switch DSW during the instantaneous charging or discharging does not cause the state of the flip-flop 36 and the scanning control circuit 38 be reversed, with the result that manual operation of the switches USW and the DSw is disabled. The scanning stop signal to be generated during the instantaneous charging or discharging neither causes the flip-flop 33 to be set, with the result that the charging/discharging control circuit 47 is not disabled and accordingly the instantaneous charging or the instantaneous discharging is continued.

2. Bidirectional Scanning Mode (FIG. 7(c))

Let it be assumed that the tuner of the receiver has been tuned to the lower limit of the receiving frequency band, i.e. the scanning voltage has reached the minimum value. When the upward scanning switch USW is closed, the flip-flop 33 is reset so that the output therefrom becomes the high level and the flip-flop 36 is also reset so that the output $c$ therefrom also becomes the high level. The outputs $e$ and $f$ of the scanning control circuit 38 become the low level and the high level, respectively. Accordingly, the output $g$ of the AND gate 42 becomes the high level and the output $i$ of the AND gate 43 becomes the high level. As a result, the normal discharging circuit 51 of the charging/discharging control circuit 47 is enabled, so that the potential memory device of the scanning voltage generating circuit Y is placed in the normal discharging state, with the result that the scanning voltage is gradually increased as shown in FIG. 7(c) and accordingly the tuning frequency of the tuner in the receiver is also raised gradually.

Now, let it be assumed that in the course of the upward scanning the downward scanning switch DSW is closed. The state of the flip-flop 33 remains the same to provide the high level output a, while the flip-flop 36 is set so that the output b becomes the high level and the output c becomes the low level. The state of the scanning control circuit 38 is reversed so that the outputs e and f become the high level and the low level, respectively. Therefore the output h of the AND gate 41 becomes the high level and the output k of the AND gate 45 also becomes the high level. Therefore, the normal charging circuit 50 of the charging/discharging control circuit 47 is enabled, with the result that the potential memory device MD of the scanning voltage generating circuit Y is placed in the normal charging state and accordingly the scanning voltage is gradually decreased as shown in FIG. 7(c) and accordingly the tuning frequency of the tuner in the receiver is gradually lowered. As a result, as shown in FIG. 7(c), in the course of the upward scanning selected by the previous closing of the upward scanning control switch USW, the scanning operation is shifted to the downward scanning operation mode at the timing t2 immediately after the closing of the downward scanning switch DSW, whereby the bidirectional scanning mode can be achieved. Thereafter the downward scanning mode is kept.

3. Continued Stop Scanning

At first, description will be made of a case where the upward scanning switch USW is closed. If and when the switch USW is closed, the flip-flop 33 is reset so that the output a therefrom becomes the high level and the flip-flop 36 is also reset so that the output c therefrom becomes the high level. The outputs e and f of the scanning control circuit 38 become the low level and the high level, respectively. Therefore, the output g of the AND gate 42 and the output i of the AND gate 43 both become the high level, so that the normal discharging circuit 51 of the charging/discharging control circuit 47 is enabled and the potential memory device MD of the scanning voltage generating circuit Y is placed in the normal discharging state to start the upward scanning.

If and when a given broadcast wave is received during the upward scanning, the output d from the AND gate 32 (which correspond to the AND gate 141 in FIG. 1), becomes the high level, as described previously, and the flip-flop 33 is set by the output d so that the output a therefrom becomes the low level. Accordingly the output g of the AND gate 42 and the output i of the AND gate 43 both become the low level, and accordingly the normal discharging circuit 51 of the charging/discharging control circuit 47 is disabled to discontinue the scanning thereafter, with the result that the reception state is achieved. In order to start again the upward scanning, the upward scanning switch USW is closed again, so that the flip-flop 33 is reset again and the output a therefrom becomes the high level, whereby the upward scanning is restarted.

When the scanning voltage reaches the maximum value, i.e. the tuning frequency becomes the upper limit of the receiving frequency band, then the upward scanning is repeated, starting from the minimum scanning voltage or the lower limit frequency of the receiving frequency band, described fully previously. Such continued stop scanning mode in the upward scanning has been illustrated in FIG. 7(a), in which the dotted line indicates that the scanning stop signal is obtained at the timing t1 to achieve the reception state.

Similarly, if and when the downward scanning switch is closed, then downward scanning mode is achieved. If and when a given broadcast wave is received during the downward scanning, the same as described in conjunction with the continued stop scanning in the upward scanning applies to such a situation. Such a continued stop scanning mode in the downward scanning has been illustrated in FIG. 7(b), in which the dotted line indicates that the stop signal is obtained at the time t1 to achieve the reception state.

4. Temporary Stop Scanning

In the following, description will be made of the temporary stop scanning mode during the upward scanning by way of an example. When the upward scanning switch USW is closed, the upward scanning is started and if the broadcast wave is received the stop signal is obtained to discontinue the scanning, so that the reception state is achieved, as more fully described in the foregoing in conjunction with the continued stop scanning mode. The stop signal withdrawn from the terminal 13 is differentiated by the differentiation circuit 62 to trigger the monostable multivibrator 63. Immediately after the lapse of the period T, the delay circuit 64 is enabled, so that the output therefrom becomes the high level for the predetermined period t. The output from the delay circuit 64 has been applied to the flip-flop 33 through the terminal 16 and the OR gate 34. Therefore, the high level output from the delay circuit 64 immediately resets the flip-flop 33, so that the output a therefrom becomes the high level and therefore the scanning is again started. In other words, the scanning is stopped only for the above described period T determined by the monostable multivibrator 63, and after the lapse of the abovementioned period the scanning is automatically started again.

If and when the switch 65 is turned to the contact 65a during the above described period T, the scanning is not started and thus the reception state is maintained. FIG. 7(d) illustrates such a temporary stop scanning mode, in which the dotted line indicates that the switch 65 is turned to the contact 65a at the time t1.

Now description will be made of the function of the delay circuit 64. Assuming that the period T has lapsed and the scanning is again started, the stop signal might still be obtained immediately after the scanning is started, because the broadcast wave has been received during the period t, whereby the flip-flop 33 could be set and the scanning could be stopped again. Thus, there is a fear that easy deviation might be impossible from the temporary stop state or the scanning might not be started. The delay circuit 64 has been provided to cause the reset state of the flip-flop 33 by the high level output of the delay circuit 64 in order to forcibly continue the scanning for the predetermined delay time t after the scanning is started, thereby to assure the detuning from the tuned frequency when the scanning is desired.

Since the circuit concerned has thus been structured, it does not happen that stop signal which might be obtained immediately after the change from the temporary stop state to the scanning state causes the scanning stop state. Nevertheless, however, the monostable multivibrator 63 could be triggered by the stop signal. This could result in the following inconvenience. First let it be assumed that a stop signal is obtained upon receipt of the broadcast wave X and the monostable multivibrator 63 is triggered by the said stop signal, whereby a reception state is continued for the period TX and thereafter the flip-flop 33 is reset by the high level output of the delay circuit 64 to start the scanning. Further let it be assumed that during a short time period since the said period TX is terminated until the said broadcast wave X is fully detuned the monostable multivibrator 63 is again triggered by the stop signal, where the said period of the monostable multivibrator 63 at this time is TO, and as a result of further scanning of the scanning voltage another broadcast wave Y is received this time. Then normally the monostable multivibrator 63 should be triggered by the stop signal obtained at that time and the reception state of the broadcast wave Y should be continued for the time period TY. However, as described previously, the monostable multivibrator 63 has already been triggered. Therefore, the reception state of the broadcast wave Y will be terminated, not after the lapse of the period TY since the receipt of the broadcast wave Y, but after the lapse of the period TO a portion of which has lapsed since before the receipt of the broadcast wave Y. In other words, it could happen that the period for the temporary stop is not determined by way of the period of the monostable multivibrator 63. In order to prevent such an inconvenience, it is necessary that the monostable multivibrator 63 is adapted not to be triggered during a time period since the period T of the monostable multivibrator 63 is terminated until detuning from the tuned frequency by the tuner is completed. It is pointed out that the FIG. 5C embodiment has been so designed to prevent such an undesired malfunction. More specifically, whenever the output $p$ of the monostable multivibrator 63 or the output $g$ of the delay circuit 64 becomes the high level, the transistor T24 is turned on, and the potential at the point $r$ becomes the ground potential, so that the output of the defferentiation circuit 62 is prevented from triggering the monostable multivibrator 63. Thus, the period of the temporary stop can always be set as a function of the period T of the monostable multivibrator 63.

Automatic Frequency Control

Now, description will be made of the automatic frequency control employed in the inventive automatic tuning apparatus. The automatic frequency control is aimed to effect fine adjustment of the scanning voltage and thus the frequency tuned by the tuner 121 in case where detuning occurs because of a drift in the potential memory device MD, the DC amplifier 56, the tuner 121, etc. caused by a variation of an ambient temperature or variation of the source voltage after the scanning is once stopped and the reception state is achieved.

If and when the ratio detected output voltage applied through the terminal 11 from the ratio detection circuit 142 in FIG. 1 and the reference voltage applied from the terminal 10 are the same, i.e. the tuning is completed by the receiver to the broadcast wave, both outputs $m$ and $n$ from the level detection circuit 31 become the low level, so that the transistors T23 and T22 constituting the inverters 58 and 57, respectively, are turned off and both outputs obtainable at the collectors thereof become the high level. If and when the intermediate frequency signal received from the terminal 14 exceeds a predetermined level, the transistor T1 of the level detection circuit 31 is turned on and the transistor T2 of the circuit 30 is turned off. As a result the output from the intermediate frequency level detection circuit 30 becomes the high level. Since the three inputs to the AND gate 32 are the high level, the high level output $d$ is obtained therefrom. This high level output $d$ is withdrawn by way of the scanning stop signal, as described previously.

Now, consider a case where slight detuning occurs in the reception state, i.e. the reference voltage and the ratio detected output become slightly imbalanced. In such a case, the state of the differential amplifier constituting the level detection circuit 31 becomes imbalanced and accordingly either the output $m$ or the output $n$ of the level detection circuit 31 becomes the high level. And the output from either the inverter 57 or 58 becomes the low level. Thus, the transistor T21 or T20 constituting the automatic frequency control charging or discharging circuit 61 or 60, respectively, becomes the conductive, as the output $m$ or $n$ of the circuit 31 becomes the high level and accordingly the potential memory device MD of the scanning voltage generating circuit Y is charged or discharged through the connection to the terminal 5. As a result the scanning voltage is thus fine adjusted and the detuning is corrected.

Now a situation is considered in which although the tuning has been completed the intermediate frequency signal is interrupted for some reason (for example, an automobile bearing a radio receiver employing the inventive automatic tuning apparatus passes through a tunnel). In such situation the broadcast wave is not received and therefore a ratio detected output becomes indefinite as compared with the reference voltage. Accordingly, it could happen that either output $m$ or $n$ of the level detection circuit 31 becomes the high level and thus either the automatic frequency control charging circuit 61 or the automatic frequency discharging circuit 60 is enabled, so that the automatic frequency control is reversely operated and an increased detuning will result. The OR gate 59 is aimed to enable the automatic frequency control charging circuit 61 and the automatic frequency control discharging circuit 60 only in the presence of intermediate frequency signal, namely only in receipt of the broadcast wave, thereby to eliminate the above described inconvenience.

Figure 8:
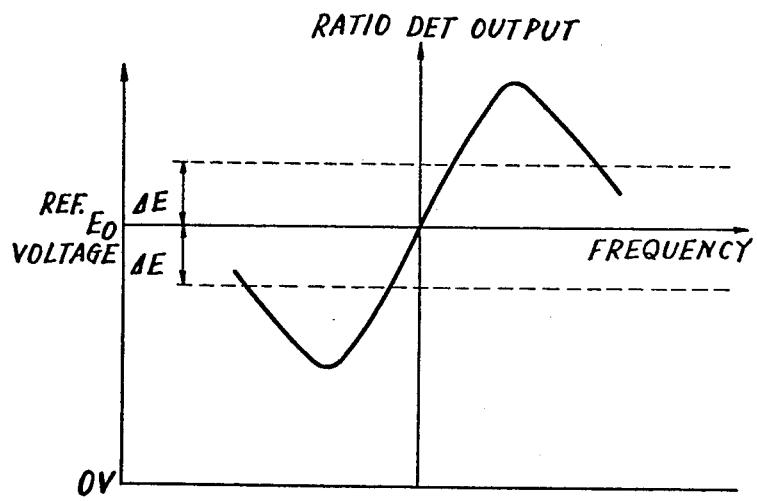
FIG. 8 is a graph showing a characteristic of the ratio detection circuit utilized in connection with the automatic frequency control.
Figure 7:
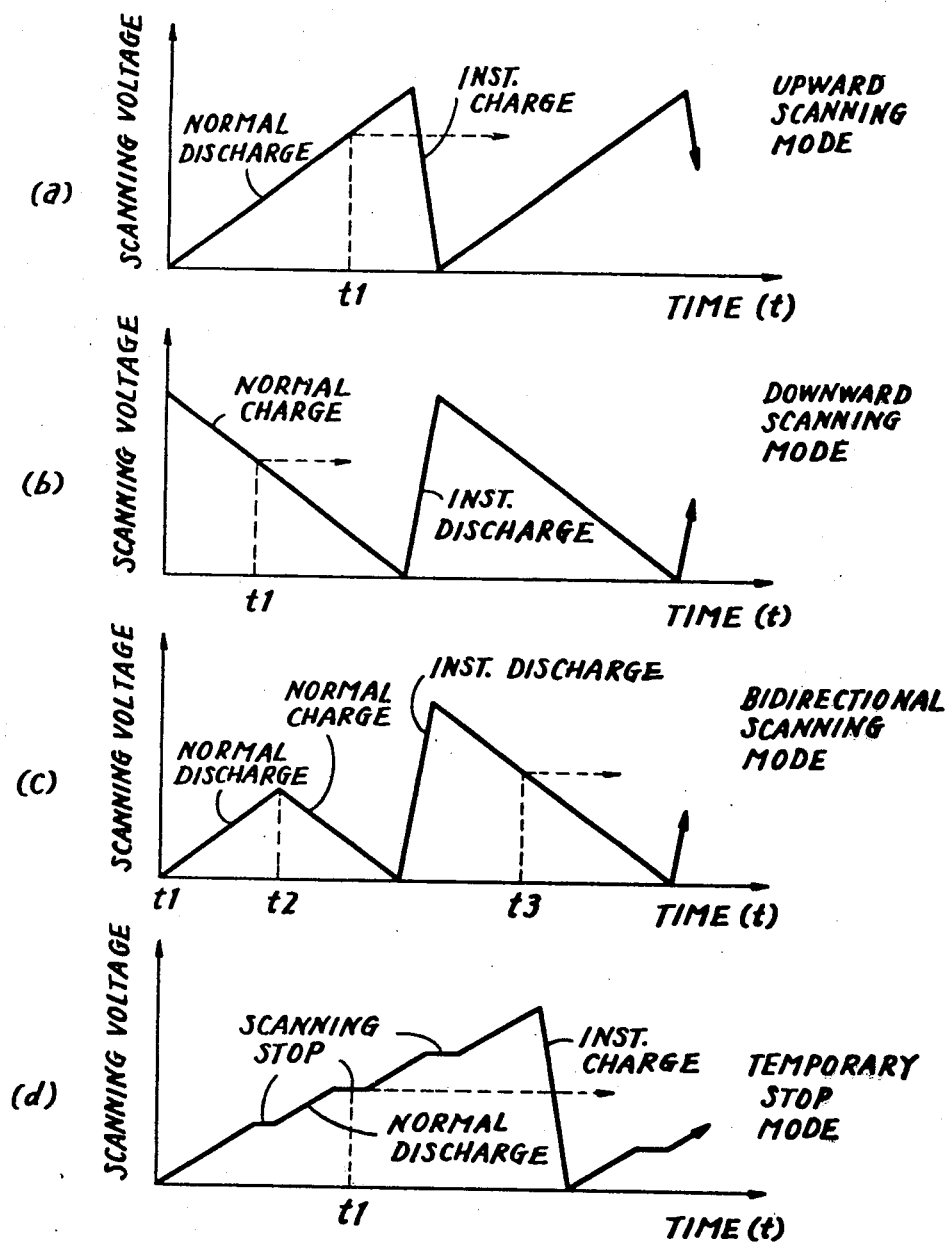

Now that an outline of the operation of the automatic frequency control has been described, more detailed description will be made in the following with reference to FIG. 8, which shows the ratio detected output characteristic. If and when the difference between the ratio detected output voltage and the reference voltage is within the predetermined range value $\Delta E$, i.e. substantial tuning has been effected, then the currents flowing through the transistors T3 and T4 of the level detection circuit 31 are the same, so that the transistor T21 constituting the automatic frequency control charging circuit 61 and the transistor T20 constituting the automatic frequency control discharging circuit 60 are both turned off, with the result that the potential memory device MD of the scanning voltage generating circuit Y is neither charged nor discharged.

If and when the difference between the ratio detected output voltage and the reference voltage exceeds the predetermined value $\Delta E$, the currents flowing through the transistors T3 and T4 of the circuit 31 also becomes imbalanced, so that either the transistor T22 of the inverter 57 or the transistor T23 of the inverter 58 is turned on. Correspondingly, the transistor T20 of the automatic frequency control discharging circuit 60 or the transistor T21 of the automatic frequency control charging circuit 61 is turned on, so that the potential memory device MD of the scanning voltage generating circuit Y is connected to the terminal 5 is discharged or charged, as the case may be. Accordingly, the scanning voltage is increased or decreased, with the result that the scanning voltage and thus the tuning frequency is fine adjusted.

In the event the intermediate frequency signal level does not exceed the predetermined level, the transistor T1 constituting the intermediate frequency signal level detection circuit 30 (Schmitt circuit) is turned off and the transistor T2 of the circuit 30 is turned on, so that the diodes D6 and D7 of the OR gate 59 are biased in the forward direction, and the transistor T20 of the circuit 60 and the transistor T21 of the circuit 61 are not turned on. As a result, the potential memory device MD of the circuit Y is not enabled and thus the scanning voltage is not fine adjusted.

Other Embodiments

Figure 9:
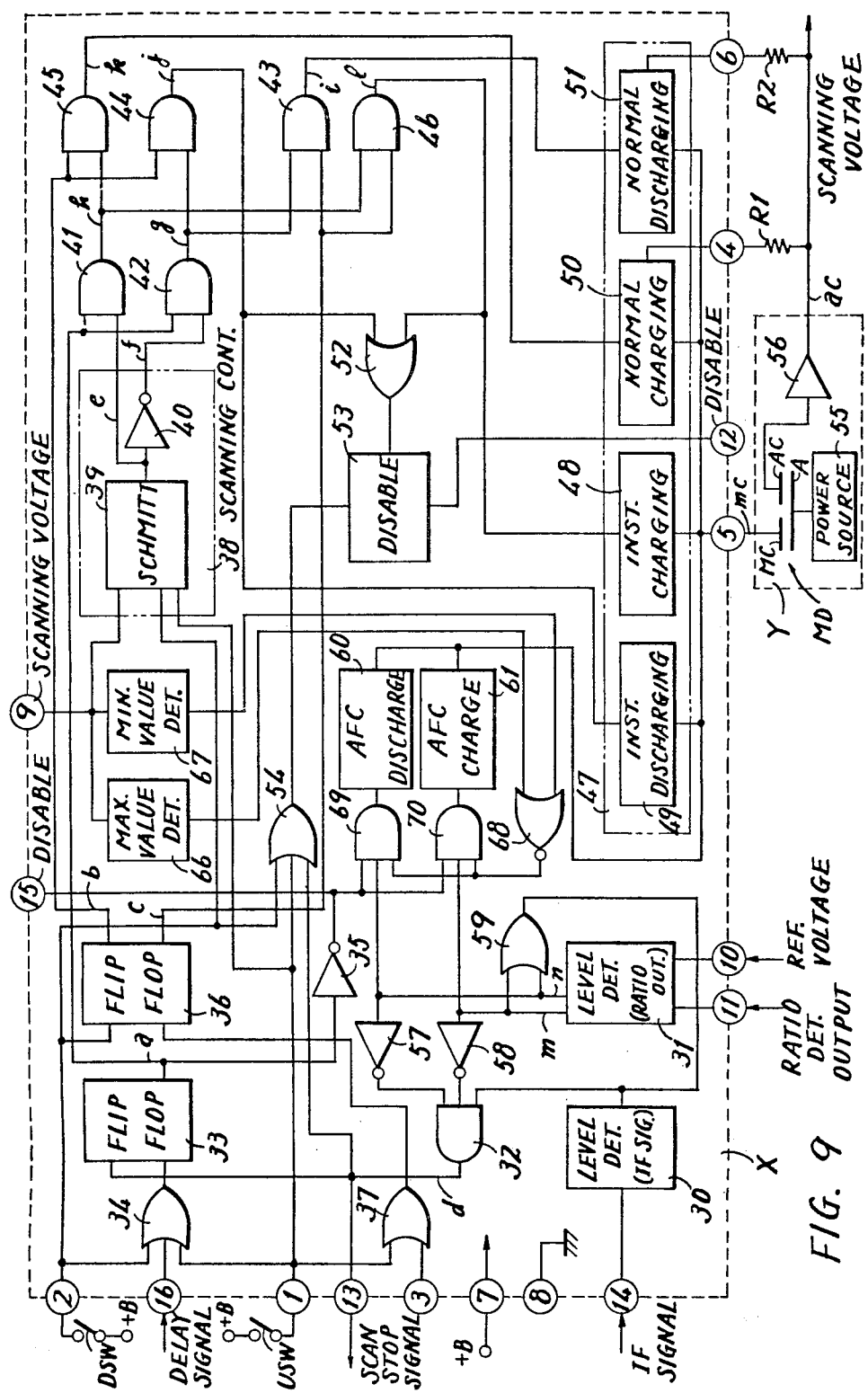
FIG. 9 shows a block diagram of another embodiment of the present invention.

FIG. 9 is a block diagram showing another embodiment of the present invention. The embodiment shown comprises a modification of the embodiment shown in FIGS. 4, 5A, 5B and 5C, in which only a portion involved in the automatic frequency control has been modified while the other portions may be embodied in substantially the same manner as in the former embodiment. More specifically, the scanning voltage applied through the terminal 9 from the scanning voltage generating circuit Y is applied to the scanning control circuit 38 and is also applied to the maximum value detection circuit 66 and the minimum value detection circuit 67. The outputs from these circuits 66 and 67 are applied to the NOR gate 68. The output from the NOR gate 68 is applied to the AND gates 69 and 70.

The AND gate 69 receives as inputs thereto the output *n* from the level detection circuit 31, the output from the inverter 35 and the output from the NOR gate 68, and the output therefrom is applied to the automatic frequency control discharging circuit 60. The AND gate 70 receives as inputs thereto the output *m* from the level detection circuit 31, the output from the inverter 35 and the output from the NOR gate 68, and the output therefrom is applied to the automatic frequency control charging circuit 61. The outputs of these automatic frequency control discharging circuit 60 and the automatic frequency control charging circuit 61 are both applied to the terminal 5 (namely, the scanning voltage generating circuit Y).

In operation, let it be assumed that the scanning operation is progressing. In such a situation, the signal from the terminal 1 or the signal from the terminal 2 and the reset output *a* of the flip-flop 33 are the high level, and either output *b* or *c* of the flip-flop is the high level, as the case may be. Accordingly, the frequency control circuit 38 and other gates 41 through 46, and the charging/discharging control circuit 47 control the potential memory device MD of the scanning voltage generating circuit Y to be in charging or discharging state, as the case may be. Therefore, the appropriate scanning voltage is obtained from the scanning voltage generating circuit Y. When the scanning voltage applied from the terminal 9 does not yet reach the maximum value or minimum value, the outputs from the maximum value detection circuit 66 or the minimum value detection circuit 67 are the low level. Accordingly, the output of the NOR gate 68 receiving these two outputs becomes the high level.

However, the output *a* of the flip-flop 33 has been the high level during the scanning, so that the output of the inverter 35 is the low level. Therefore, the AND gates 69 and 70, which receive the output of the inverter 35 as well, both provide the low level outputs therefrom. Accordingly, neither the automatic frequency control discharging circuit 60 nor the automatic frequency control charging circuit 61 is enabled, and accordingly, the scanning voltage is not fine adjusted. Since the automatic frequency control is not operated during the scanning, the scanning can be restarted soon after the broadcast wave is tuned, with the result that the scanning speed is raised. More specifically, if the scanning had been restarted as a result of manual operation of the switch USW or DSW and once a given broadcast has been tuned, in an automatic tuning apparatus without the present embodiment shown, then the automatic frequency control would have been operated, since there would have been a slight detuning and the intermediate signal level would have exceeded a predetermined level, so that the automatic frequency control current would have flowed against the normal scanning (discharging or charging) current flowing through the potential memory device MD of the circuit Y serving to return the tuning frequency as before. This would have resulted in a delay in the scanning speed particularly in the occasion of detuning from the tuned frequency when the scanning is restarted, which means that more time would have been required for deviation of the tuner from the reception state. This is much more aggravated in the region of the lower scanning voltage, or a region of the lower frequency in the receiving frequency band, because the normal scanning current becomes smaller in such region. Thus, it is desired that the automatic frequency control operation is disabled during the scanning operation.

If and when the scanning voltage from the terminal 9 reaches the maximum value or the minimum value, the output from the maximum value detection circuit 66 or the minimum value detection circuit 67 becomes the high level. Accordingly, the output of the NOR gate 68 becomes the low level, and the outputs from the AND gates 69 and 70 become low level. Accordingly, neither the automatic frequency control discharging circuit 60 nor the automatic frequency control charging circuit 61 is enabled any more, so that the automatic frequency control is not effected, whereby the potential memory device MD is prevented from being destroyed by over charging or over discharging. More specifically, the potential memory device MD has a predetermined variable range of the terminal voltage thereof and usually the full range of such variable terminal voltage is adapted to just cover the receiving frequency band of the receiver. Assuming that a certain broadcast wave is tuned by the tuner just at the maximum value of or the minimum value of the scanning voltage, the automatic frequency control is also operated even at such a tuning point, so that a current is caused to flow through the potential memory device MD to overly charge or discharge the device exceeding a predetermined value, with the result that the potential memory device is destroyed. Thus, it is desired that the automatic frequency control is stopped if and when the scanning voltage reaches the maximum value or the minimum value.

FIG. 10 is a schematic diagram of a further embodiment of the present invention. The embodiment shown comprises a modification of the embodiment described with reference to FIGS. 3 to 5, in which a portion involved in the temporary stop scanning operation mode has been modified which corresponds to a portion shown in FIG. 5C. More specifically, a delay circuit 71 is structured such that the terminal 15 for withdrawing the audio disabling signal is connected to one terminal of the capacitor C3, another terminal of which is connected to the base of the transistor T28 and is also connected to the ground through a resistor R4. The emitter of the transistor T28 is connected to the +B voltage source and the collector thereof is connected to the ground through a proper resistor and is also connected through a resistor R5 to one terminal of a capacitor C4. The said one terminal of the capacitor C4 is also connected to the contact 65b of the switch 65 and another terminal of the capacitor C4 is connected to the ground through a resistor R6 and is also connected to the terminal 16. Thus, it is seen that the embodiment shown, different from the FIG. 5C embodiment, utilizes the audio disabling signal as a trigger signal to activate the temporary stop operation mode.

Now, operation of the embodiment shown will be described in the following with simultaneous reference to FIG. 11, which shows waveforms of the signals at various portions in the FIG. 10 embodiment. In operation, the mode selection switch 65 is turned to the contact 65b in order to select the temporary stop scanning mode. During the scanning operation, the signal $s$ of the low level obtained from the termina 15 is withdrawn as the audio disabling signal. If and when a given broadcast wave is tuned by the receiver at the timing $t1$, the output $s$ obtainable from the terminal 15 changes from the low level to the high level as shown in FIG. 11($s$). Accordingly, the base of the transistor T28 is biased in the reverse direction (non-conduction direction) by the terminal voltage of the capacitor C3, as charged, as shown in FIG. 11($t$), so that the transistor T28 is turned off and the potential at the collector thereof changes to the low level at the timing $t1$, as shown in FIG. 11($u$).

However, since the capacitor C3 is discharged through the resistor R4, the base potential of the transistor T28 changes as shown in FIG. 11($t$), so that the transistor T28 becomes conductive again at the timing $t2$ at the lapse of time period T since the timing $t1$, and accordingly the output $u$ at the collector thereof is turned to the high level again, as shown in FIG. 11($u$). The leading edge of the collector output $u$ at the timing $t1$ and the trailing edge of the collector output $u$ at the timing $t2$ are differentiated by the resistors R5 and R6 and the capacitor C4 in the subsequent stage, so that the differentiated output as shown in FIG. 11($v$) is obtained. The differentiated output at the timing $t2$, of the high level and having a time duration $t$, is applied to the terminal 16 as an output therefrom (scanning trigger signal). More specifically, the time $T$ ($t1$-$t2$) is a temporary stop time provided by the circuit 71 and the pulse of the time duration $t$ is the above described delay signal. This signal is applied to the terminal 16 and further through the OR gate 34 to the reset input of the flip-flop 33. Accordingly, even during the time period $t$ of this signal the flip-flop 33 is kept reset to provide the high level output $a$ to keep the apparatus in the scanning state.

Figure 5C:
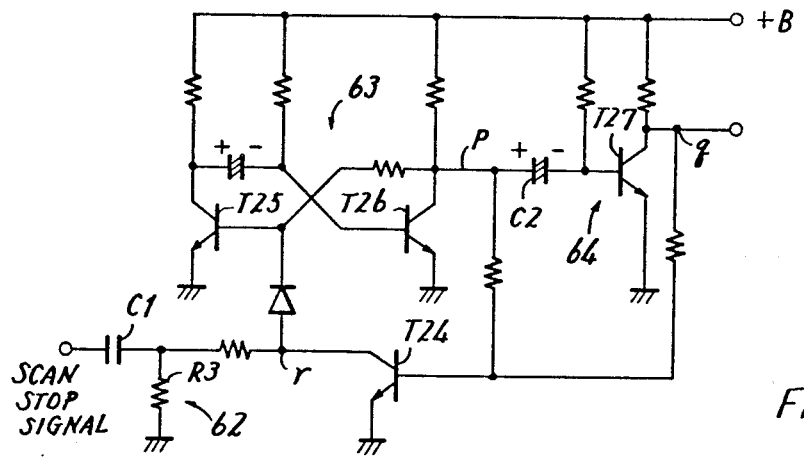

In the embodiment shown, the audio disabling signal has been utilized to activate the circuit 71, rather than the stop signal obtainable from the AND gate 32 in the FIG. 5C embodiment, it is not necessary to withdraw the stop signal externally of the control circuit X. This is particularly advantageous in implementing the control circuit X in the form of an integrated circuit, in that the number of the terminals of the circuit X can be decreased.

In the foregoing description, the embodiments shown have been described as achieving all the above described operation modes. However, if it is desired to provide an automatic tuning apparatus only achieving the upward scanning operation mode, for example, then the terminal 3 of the control circuit X is connected to the +B voltage source and the downward scanning switch DSW may be removed. Thus, it is seen from the foregoing description, that the transistor T10 of the flip-flop 36 for indicating the upward scanning is not turned on, so that the output $c$ therefrom is kept to be the high level, and therefore, the apparatus for only the upward scanning mode is provided.

Although this invention has been described and illustrated in detail, it is to be clearly understood that the same is by way of illustration and example only and is not to be taken by way of limitation, the spirit and scope of this invention being limited only by the terms of the appended claims.

What is claimed is:
1. An automatic tuning apparatus comprising;
 tuning means comprising a voltage controlled variable reactance device,
 means for supplying a control voltage to said voltage controlled variable reactance device, said control voltage determining a reactance value of said voltage controlled variable reactance device and thus determining a tuning frequency of said tuning means,
 means coupled to said tuning means for providing a signal indicative of the degree of tuning of said tuning means,
 means for changing said control voltage supplied from said control voltage supplying means to said voltage controlled variable reactance device for causing a change in reactance of said voltage controlled reactance device and thus a change in a tuning frequency of said tuning means,
 manually operable means for instructing said change in a tuning frequency of said tuning means,
 first store means responsive to the instructing signal of said manually operable means for assuming one storing state thereof and responsive to said signal indicative of the degree of tuning of said tuning means for assuming the other storing state,
 second store means responsive to the instructing signal of said manually operable means for assuming a predetermined storing state thereof and responsive to a predetermined maximum value and a predetermined minimum value of said control voltage for reversing the present storing state thereof,
 means responsive to the storing states of said second store means for determining a direction of the change of said control voltage supplied from said control voltage supplying means, and
 means responsive to said one storing state of said first store means for enabling said means for changing said control voltage supplied from said control voltage supplying means.

2. An automatic tuning apparatus in accordance with claim 1, in which said manually operable means comprises manually operable means for instructing said change in a tuning frequency of said tuning means in the direction toward a higher frequency.

3. An automatic tuning apparatus in accordance with claim 1, in which said manually operable means comprises manually operable means for instructing said change in a tuning frequency of said tuning means in the direction toward a lower frequency.

4. An automatic tuning apparatus in accordance with claim 1, in which said manually operable means comprises
first manually operable means for instructing said change in a tuning frequency of said tuning means in the direction toward a higher frequency, and
second manually operable means for instructing said change in a tuning frequency of said tuning means in the direction toward a lower frequency.

5. An automatic tuning apparatus in accordance with claim 4, which further comprises
third store means responsive to the instructing signal of said first manually operable means for assuming one storing state thereof and responsive to the instructing signal of said second manually operable means for assuming the other storing state thereof.

6. An automatic tuning apparatus in accordance with claim 5, which further comprises means responsive to the storing state of said second and third store means for controlling said enabling means for changing a tuning frequency of said tuning means in a relatively slow speed in the direction selected by said manually operable means and for changing a tuning frequency of said tuning means in a relatively rapid speed in the direction not selected by said manually operable means.

7. An automatic tuning apparatus in accordance with claim 6, in which said controlling means comprises
first means for driving said control voltage changing means for changing the tuning frequency in the relatively slow speed in the direction toward a higher frequency,
second means for driving said control voltage changing means for changing the tuning frequency in the relatively rapid speed in the direction toward a higher frequency,
third means for driving said control voltage changing means for changing the tuning frequency in the relatively slow speed in the direction toward a lower frequency,
fourth means for driving said control voltage changing means for changing the tuning frequency in the relatively rapid speed in the direction toward a lower frequency, and
means responsive to the storing state of said second and third store means for providing a logical combination output thereof for controlling a corresponding one of said first, second, third and fourth driving means.

8. An automatic tuning apparatus in accordance with claim 6, which further comprises
means responsive to said control voltage for indicating a tuning frequency of said tuning means, and
means responsive to said controlling means for providing a signal for disabling said indicating means during said relatively rapid speed period.

9. An automatic tuning apparatus in accordance with claim 7, which further comprises means responsive to said controlling means for providing a signal for disabling the instructing signal of said manually operable means during said relatively rapid speed period.

10. An automatic tuning apparatus in accordance with claim 1, which comprises means responsive to the storing state of said first store means for providing a signal for disabling an audio signal.

11. An automatic tuning apparatus in accordance with claim 1, in which said means for providing a signal indicative of the degree of tuning of said tuning means comprises
means for providing a signal associated with an amplitude detected signal,
means for providing a signal associated with a frequency detected signal, and
means responsive to simultaneous outputs of said means for providing the amplitude associated signal and said means for providing the frequency associated signal.

12. An automatic tuning apparatus in accordance with claim 1, which further comprises means responsive to deviation of the tuning frequency by said tuning means for driving said control voltage changing means for compensating said deviation of the tuning frequency.

13. An automatic tuning apparatus in accordance with claim 12, which further comprises means responsive to the absence of said signal indicative of the degree of the tuning of said tuning means for disabling said driving means.

14. An automatic tuning apparatus in accordance with claim 12, which further comprises means responsive to a value higher than said predetermined maximum value and a value lower than said predetermined minimum value of said control voltage for disabling said driving means.

15. An automatic tuning apparatus in accordance with claim 12, which comprises means responsive to the storing state of said first store means for disabling said driving means.

16. An automatic tuning apparatus in accordance with claim 1, which further comprises means for causing said first store means to assume one storing state again after the lapse of a predetermined time period since said control voltage changing means is disabled responsive to said other storing state of said first store means assumed as a result of tuning of said tuning means.

17. An automatic tuning apparatus in accordance with claim 16, in which said causing means comprises
means responsive to said signal indicative of the degree of tuning of said tuning means for providing a first pulse signal having a predetermined pulse width corresponding to said predetermined time period, and
means responsive to the trailing edge of said first pulse signal for providing a second pulse for causing said first store means to assume said one storing state.

18. An automatic tuning apparatus in accordance with claim 17, which further comprises means responsive to said first and second pulses for preventing said first pulse providing means from being triggered.

19. An automatic tuning apparatus in accordance with claim 16, in which said causing means comprises
means responsive to the change in the storing state of said first store means responsive to said signal indicative of the degree of tuning of said tuning means for providing a first pulse signal having a predetermined pulse width, and
means responsive to the trailing edge of said first pulse signal for providing a second pulse for causing said first store means to assume said one storing state.

* * * * *